US012120864B2

(12) United States Patent
Sakui et al.

(10) Patent No.: US 12,120,864 B2
(45) Date of Patent: Oct. 15, 2024

(54) MEMORY DEVICE USING SEMICONDUCTOR ELEMENT

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 194 days.

(21) Appl. No.: 17/970,836

(22) Filed: Oct. 21, 2022

(65) Prior Publication Data

US 2023/0038107 A1 Feb. 9, 2023

Related U.S. Application Data

(63) Continuation-in-part of application No. 17/478,282, filed on Sep. 17, 2021, now Pat. No. 11,776,620.
(Continued)

(30) Foreign Application Priority Data

Oct. 21, 2021 (WO) .................. PCT/JP2021/038886

(51) Int. Cl.
*G11C 11/4096* (2006.01)
*G11C 11/404* (2006.01)
(Continued)

(52) U.S. Cl.
CPC ............ *H10B 12/20* (2023.02); *G11C 11/404* (2013.01); *G11C 11/4096* (2013.01); *G11C 11/4097* (2013.01); *G11C 2211/4016* (2013.01)

(58) Field of Classification Search
CPC . G11C 11/4096; G11C 11/404; G11C 11/406; G11C 11/4076; G11C 11/4091; H10B 12/50; H10B 12/00; H01L 29/66666
(Continued)

(56) References Cited

U.S. PATENT DOCUMENTS

2003/0111681 A1 7/2003 Kawanaka
2006/0049444 A1 3/2006 Shino
(Continued)

FOREIGN PATENT DOCUMENTS

JP    H 02-188966 A    7/1990
JP    H 03-171768 A    7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka "Impact of Surrounding Gate Transistor (SGT) for Ultra-High Density LSI's", IEEE Transaction on Electron Devices, vol. 38, No. 3, pp. 573-578 (1991).
(Continued)

*Primary Examiner* — Michael T Tran
(74) *Attorney, Agent, or Firm* — Crowell & Moring LLP

(57) ABSTRACT

A memory device includes pages containing memory cells arranged in an array on a substrate. In each memory cell, a voltage applied to a first gate conductor layer, second gate conductor layer, third gate conductor layer, first impurity layer, and second impurity layer is controlled to form a hole group by impact ionization inside a channel semiconductor layer, and a page write operation of holding the hole group and a page erase operation of removing the hole group are performed. The first impurity layer is connected to a source line, the second impurity layer to a bit line, the first gate conductor layer to a first plate line, the second gate conduc-
(Continued)

tor layer to a second plate line, and the third gate conductor layer to a word line. A page erase operation is performed without inputting a positive or negative bias pulse to the bit line and the source line.

20 Claims, 15 Drawing Sheets

Related U.S. Application Data which is a continuation of application No. PCT/JP2020/048952, filed on Dec. 25, 2020.

(51) Int. Cl.
*G11C 11/4097* (2006.01)
*H10B 12/00* (2023.01)

(58) Field of Classification Search
USPC .................................... 365/189.011, 230.05
See application file for complete search history.

(56) References Cited

U.S. PATENT DOCUMENTS

| 2006/0157738 | A1  | 7/2006  | Kawanaka |              |
|--------------|-----|---------|----------|--------------|
| 2008/0137394 | A1  | 6/2008  | Shimano et al. |        |
| 2008/0212366 | A1  | 9/2008  | Ohsawa   |              |
| 2022/0366986 | A1* | 11/2022 | Sakui    | G11C 16/0483 |
| 2022/0367469 | A1* | 11/2022 | Sakui    | G11C 11/4096 |
| 2022/0367473 | A1* | 11/2022 | Sakui    | G11C 11/406  |
| 2022/0367474 | A1* | 11/2022 | Sakui    | H10B 12/20   |
| 2022/0367681 | A1* | 11/2022 | Harada   | H01L 21/823885 |

FOREIGN PATENT DOCUMENTS

| JP | 2003-188279    |   | 7/2003 |
|----|----------------|---|--------|
| JP | 2006-080280    | A | 3/2006 |
| JP | 2008-147514    | A | 6/2006 |
| JP | 3957774        | B2| 5/2007 |
| JP | 2008-218556    | A | 9/2008 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "Novel 4F2 Dram Cell with Vertical Pillar Transistor (VPT)," 2011 Proceeding of the European Solid-State Device Research Conference, (2011).
H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).
K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007) pp. 767-770.
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).
M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Leiter, vol. 31, No. 5, pp. 405-407 (2010).
J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).
T. Ohsawa, K. Fujita, T. Higashi, Y. Iwata, T. Kajiyama, Y. Asao, and K. Sunouchi, "Memory design using a one-transistor gain cell on SOI", IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM 4 pgs. (2006).
E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.
N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.
H. Jiang, N. Xu, B. Chen, L. Zeng, Y. He, G. Du, X. Liu and X. Zhang: "Experimental investigation of self heating effect (SHE) in multiple-fin SOI FinFETs", Semicond. Sci. Technol. 29 (2014) 115021, 9 pgs.
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.
F. Morishita, H. Noda, I. Hayashi, T. Gyohten, M. Oksmoto, T. Ipposhi, S. Maegawa, K. Dosaka, and K. Arimoto: "Capacitorless Twin-Transisior Random Access Memory (TTRAM) on SOI", IEICE Trans. Electron, vol. E90-C, No. 4 pp. 765-771 (2007).
International Search Report (PCT/ISA/210) (Japanese) from PCT/JP2021/038886 dated Dec. 7, 2021, 3 pgs.
English translation of International Search Report (PCT/ISA/210) from PCT/JP2021/038886 dated Dec. 7, 2021, 2 pgs.
International Written Opinion (PCT/ISA/237) (Japanese) from PCT/JP2021/038886 dated Dec. 7, 2021, 4 pgs.

\* cited by examiner

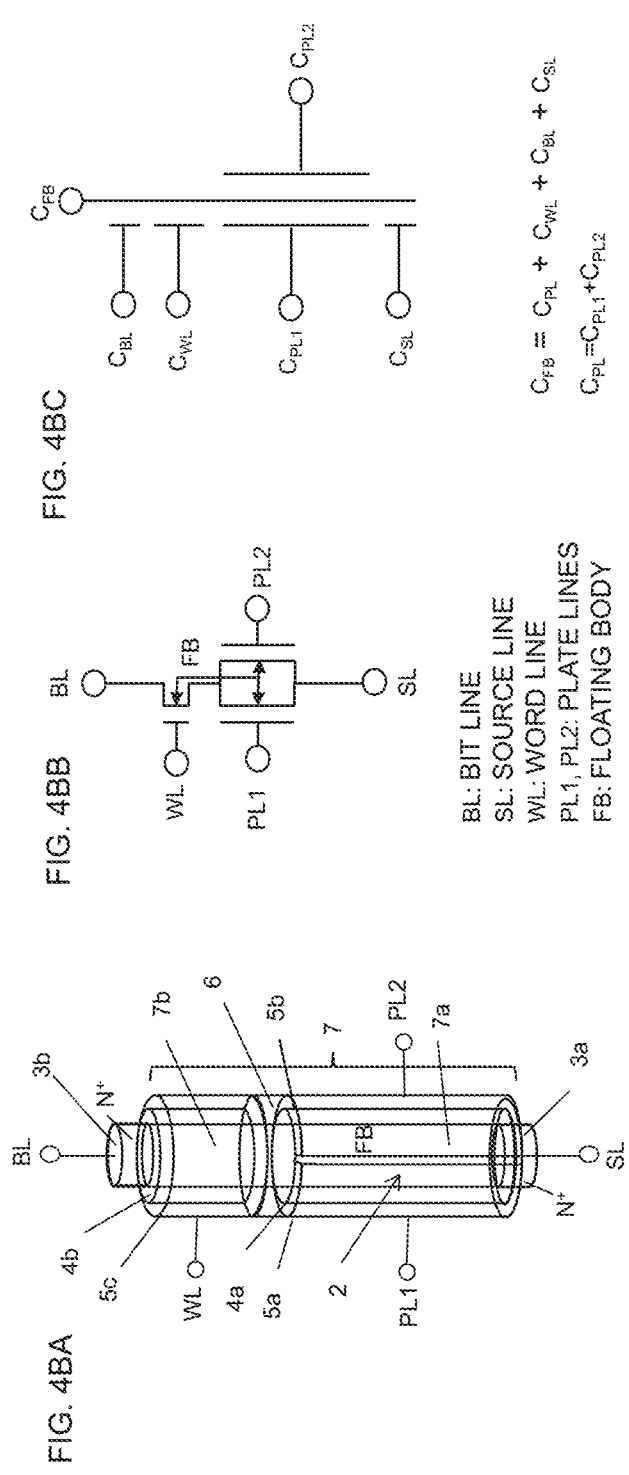
FIG. 4BA
FIG. 4BB
BL: BIT LINE
SL: SOURCE LINE
WL: WORD LINE
PL1, PL2: PLATE LINES
FB: FLOATING BODY
FIG. 4BC
$C_{FB} = C_{PL} + C_{WL} + C_{BL} + C_{SL}$
$C_{PL} = C_{PL1} + C_{PL2}$
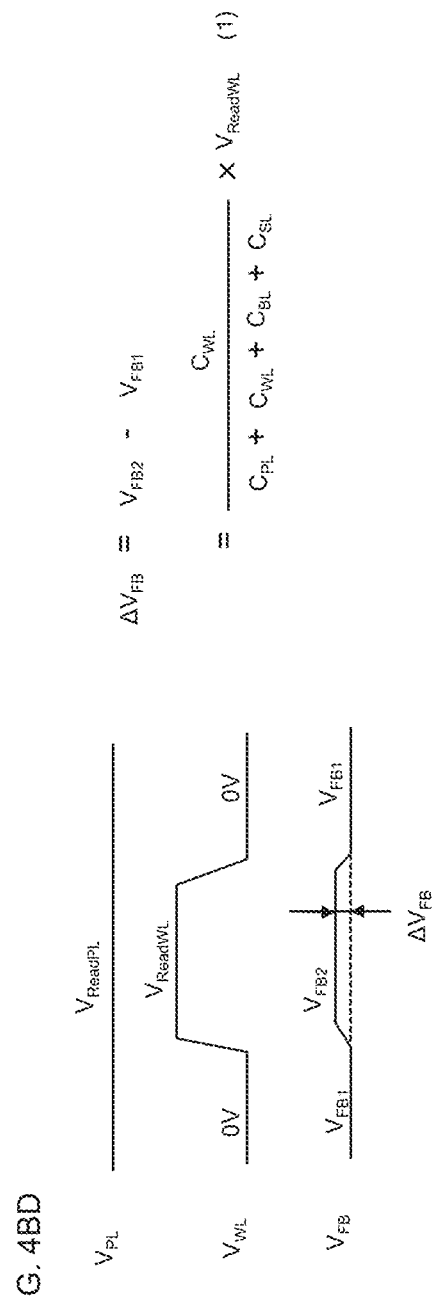
FIG. 4BD
$$\Delta V_{FB} = V_{FB2} - V_{FB1}$$
$$= \frac{C_{WL}}{C_{PL} + C_{WL} + C_{BL} + C_{SL}} \times V_{ReadWL} \quad (1)$$

$$C_{FB} = C_{WL} + C_{BL} + C_{SL} \quad (2)$$

$$\beta_{WL} = \frac{C_{WL}}{C_{WL} + C_{BL} + C_{SL}} \quad (3)$$

$$\Delta V_{FB} = V_{FB2} - V_{FB1}$$
$$= \beta_{WL} \times V_{WLH} \quad (4)$$

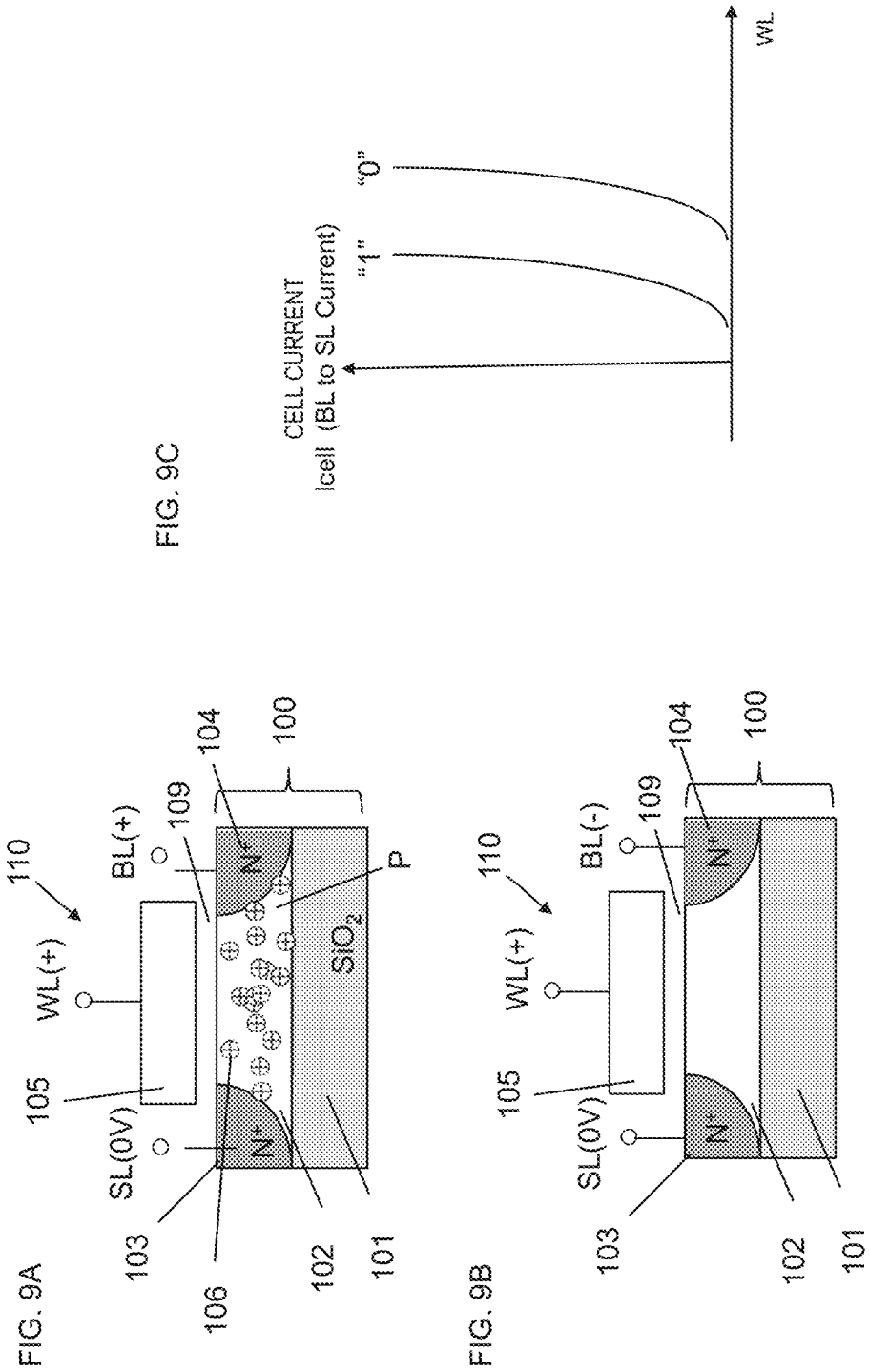

MEMORY DEVICE USING SEMICONDUCTOR ELEMENT

RELATED APPLICATIONS

The present application is a continuation-in-part application of Ser. No. 17/478,282, filed Sep. 17, 2021, which is a continuation application of PCT/JP2020/048952, filed on Dec. 25, 2020. The present application also claims priority under 35 U.S.C. § 119 to PCT/JP2021/038886, filed Oct. 21, 2021, the entire contents of which are incorporated herein by reference.

BACKGROUND OF THE INVENTION

1. Field of the Invention

The present invention relates to a memory device using a semiconductor element.

2. Description of the Related Art

In recent years, the development of large scale integration (LSI) technique has demanded higher integration and higher performance of memory elements.

In normal planar-type metal-oxide-semiconductor (MOS) transistors, the channel extends in the horizontal direction along the upper surface of a semiconductor substrate. In contrast, the channel of surrounding gate transistors (SGTs) extends in a direction perpendicular to the upper surface of a semiconductor substrate (for example, see Japanese Unexamined Patent Application Publications No. 2-188966 and No. 3-171768; and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, SGTs can increase the density of a semiconductor device compared to planar-type MOS transistors. Using this SGT as a selection transistor can increase the density of the following: a dynamic random access memory (DRAM) to which a capacitor is connected (for example, see H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)); a phase change memory (PCM) to which a variable resistance element is connected (for example, see H. S. Philip Wong, S. Raoux, S. Kim, Jiale Liang, J. R. Reifenberg, B. Rajendran, M. Asheghi, and K. E. Goodson: "Phase Change Memory," Proceeding of IEEE, Vol. 98, No. 12, December, pp. 2201-2227 (2010)); a resistive random access memory (RRAM) (for example, see T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007)); and a magneto-resistive random access memory (MRAM) that changes its resistance by changing the direction of magnetic spin using an electric current (for example, see W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)). In addition, there is also a DRAM memory cell composed of one MOS transistor without a capacitor (see J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012)). The present application relates to a dynamic flash memory that can be composed only of a MOS transistor without a variable resistance element or a capacitor.

FIGS. 7A to 7D illustrate a write operation, FIGS. 8A and 8B illustrate an operational problem, and FIGS. 9A to 9C illustrate a read operation of a DRAM memory cell composed only of one MOS transistor without a capacitor as mentioned above (see Japanese Patent No. 3957774; J. Wan, L. Rojer, A. Zaslaysky, and S. Critoloveanu (2012); T. Ohsawa, K. Fujita, T. Higashi, Y. Iwata, T. Kajiyama, Y. Asao, and K. Sunouchi: "Memory design using a one-transistor gain cell on SOT," IEEE JSSC, Vol. 37, No. 11, pp. 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, and A. Nitayama: "Floating Body RAM Technology and its Scalability to 32 nm Node and Beyond," IEEE IEDM (2006); and E. Yoshida: "A Capacitorless 1T-DRAM Technology Using Gate-Induced Drain-Leakage (GIDL) Current for Low-Power and High-Speed Embedded Memory," IEEE IEDM (2006)). FIG. 7A illustrates a state in which "1" is written. Here, a memory cell is formed in a silicon on insulator (SOI) substrate 100, and is composed of a source N$^+$ layer 103 to which a source line SL is connected (hereinafter, a semiconductor region containing a high concentration of donor impurities is referred to as an "N$^+$ layer"), a drain N$^+$ layer 104 to which a bit line BL is connected, a gate conductive layer 105 to which a word line WL is connected, and a floating body 102 of a MOS transistor 110. The memory cell of dynamic random access memory (DRAM) is composed of one MOS transistor 110 having no capacitor. Note that a SiO$_2$ layer 101 of the SOI substrate is immediately below the floating body 102. The MOS transistor 110 is operated in a saturated range when "1" is written to the memory cell composed of one MOS transistor 110. That is, a channel 107 of electrons extending from the source N$^+$ layer 103 has a pinch-off point 108, and does not reach the drain N$^+$ layer 104 to which the bit line BL is connected. When the bit line BL connected to the drain N$^+$ layer 104 and the word line WL connected to the gate conductive layer 105 are both set to a high voltage, and when the MOS transistor 110 is operated by setting the gate voltage to about ½ of the drain voltage, the electric field strength becomes maximum at the pinch-off point 108 near the drain N$^+$ layer 104. As a result, the accelerated electrons flowing from the source N$^+$ layer 103 toward the drain N$^+$ layer 104 collide with the Si lattice and lose kinetic energy at that time, which in turn generates electron-hole pairs (impact ionization). Most of the generated electrons (not illustrated) reach the drain N$^+$ layer 104. Also, a very small number of very hot electrons jump over a gate oxide film 109 to reach the gate conductive layer 105. Holes 106 generated at the same time then charge the floating body 102. In this case, the generated holes 106 contribute as an increment of a multitude of carriers because the floating body 102 is P-type Si. The floating body 102 is filled with the generated holes 106, and, when the voltage of the floating body 102 becomes higher than the source N$^+$ layer 103 by Vb or more, further generated holes 106 are discharged into the source N$^+$ layer 103. Here, Vb is the built-in voltage of the PN junction between the source N$^+$ layer 103 and the floating body 102 of the P layer, which is approximately 0.7 V. FIG. 7B illustrates the floating body 102 saturated and charged with the generated holes 106.

Next, the operation of writing "0" to the memory cell 110 will be described using FIG. 7C. For the common selection word line WL, randomly there are "1" written memory cells 110 and "0" written memory cells 110. FIG. 7C illustrates the change from the "1" write state to the "0" write state. When "0" is written, the voltage of the bit line BL is biased negatively and the PN junction between the drain N⁺ layer 104 and the floating body 102 of the P layer is biased forward. As a result, the holes 106 previously generated in the previous cycle in the floating body 102 flow into the drain N⁺ layer 104 connected to the bit line BL. At the end of the write operation, two memory cell states are obtained: the memory cell 110 filled with the generated holes 106 (FIG. 7B) and the memory cell 110 from which the generated holes 106 are discharged (FIG. 7C). The potential of the floating body 102 of the memory cell 110 filled with the holes 106 is higher than that of the floating body 102 having no generated holes 106. Therefore, the threshold voltage of the "1" written memory cell 110 is lower than the threshold voltage of the "0" written memory cell 110. This is illustrated in FIG. 7D.

Next, the operational problem of the memory cell composed of one MOS transistor 110 will be described using FIGS. 8A and 8B. As illustrated in FIG. 8A, the capacitance $C_{FB}$ of the floating body 102 is the sum total of the capacitance $C_{WL}$ between the gate to which the word line WL is connected and the floating body 102, the junction capacitance $C_{SL}$ of the PN junction between the source N⁺ layer 103 to which the source line SL is connected and the floating body 102, and the junction capacitance $C_{BL}$ of the PN junction between the drain N⁺ layer 104 to which the bit line BL is connected and the floating body 102, which is expressed as:

$$C_{FB}=C_{WL}+C_{BL}+C_{SL} \quad (2)$$

In addition, the capacitance coupling ratio βWL between the gate to which the word line WL is connected and the floating body 102 is expressed as:

$$\beta_{WL}=C_{WL}(C_{WL}+C_{BL}+C_{SL}) \quad (3)$$

Therefore, when the word line voltage $V_{WL}$ swings at the time of reading or writing, the voltage of the floating body 102, which serves as a storage node (contact) of the memory cell, is also affected. This is illustrated in FIG. 8B. When the word line voltage $V_{WL}$ rises from 0 V to $V_{WLH}$ at the time of reading or writing, the voltage $V_{FB}$ of the floating body 102 rises to $V_{FB2}$ due to the capacitive coupling with the word line WL from an initial state voltage $V_{FB1}$ before the word line voltage $V_{WL}$ changes. The voltage change amount $\Delta V_{FB}$ is expressed as:

$$\Delta V_{FB}=V_{FB2}-V_{FB1}=\beta_{WL} \times V_{WLH} \quad (4)$$

Here, in the $\beta_{WL}$ of Formula (3), the contribution rate of $C_{WL}$ is large, which is, for example, $C_{WL}:C_{BL}:C_{SL}=8:1:1$. In this case, $\beta_{WL}=0.8$. When the word line WL changes from, for example, 5 V at the time of writing to 0 V after the writing ends, the floating body 102 is also subjected to amplitude noise at 5 V×$\beta_{WL}$=4 V due to the capacitive coupling of the word line WL and the floating body 102. For this reason, there has been a problem that the potential difference margin between the "1" potential and the "0" potential of the floating body 102 at the time of writing is not sufficient.

FIGS. 9A to 9C illustrate the readout operation. FIG. 9A illustrates the state in which "1" is written, and FIG. 9B illustrates the state in which "0" is written. In practice, however, even if Vb is written to the floating body 102 at the time of writing "1", the floating body 102 is lowered to a negative bias when the word line WL returns to 0 V at the end of writing. When "0" is written, the floating body 102 is further biased negatively. As illustrated in FIG. 9C, the potential difference margin between "1" and "0" is not large enough at the time of writing, and accordingly it is difficult to commercialize the DRAM memory cell having no capacitor in practice.

In a single-transistor DRAM (gain cell) having no capacitor in a memory device, the capacitive coupling between the word line and the floating body is large, and, when the potential of the word line swings during data reading or writing, there is a problem that this is transmitted as noise directly to the floating body. As a result, problems such as erroneous readout and incorrect rewriting of the stored data occur, making it difficult to practicalize a single-transistor DRAM (gain cell) having no capacitor.

SUMMARY OF THE INVENTION

To solve the above-described problems, a memory device according to the present invention is a memory device in which a page is composed of a plurality of memory cells arrayed on a substrate in a row direction, and a plurality of pages are arrayed in a column direction. Each of the memory cells included in each of the pages includes: a semiconductor base standing on the substrate in a vertical direction relative to the substrate or extending on the substrate in a horizontal direction relative to the substrate; a first impurity layer and a second impurity layer at two ends of the semiconductor base; a first gate insulating layer surrounding a portion or all of a side surface of the semiconductor base between the first impurity layer and the second impurity layer, the first gate insulating layer being in contact with or proximate to the first impurity layer; a second gate insulating layer surrounding the side surface of the semiconductor base, being connected to the first gate insulating layer, and being in contact with or proximate to the second impurity layer; a first gate conductor layer and a second gate conductor layer covering two opposite side surfaces of the first gate insulating layer while being separate from each other; a third gate conductor layer covering the second gate insulating layer; and a channel semiconductor layer of the semiconductor base covered with the first gate insulating layer and the second gate insulating layer. A voltage applied to the first gate conductor layer, the second gate conductor layer, the third gate conductor layer, the first impurity layer, and the second impurity layer is controlled to form a hole group by impact ionization inside the channel semiconductor layer, and the hole group is held. In a page write operation, a voltage of the channel semiconductor layer is set to a first data holding voltage that is higher than a voltage of one or both of the first impurity layer and the second impurity layer. In a page erase operation, a voltage applied to the first impurity layer, the second impurity layer, the first gate conductor layer, the second gate conductor layer, and the third gate conductor layer is controlled to extract the hole group from one or both of the first impurity layer and the second impurity layer, and the voltage of the channel semiconductor layer is set to a second data holding voltage that is lower than the first data holding voltage. Of the memory cell, the first impurity layer is connected to a source line, the second impurity layer is connected to a bit line, the first gate conductor layer is connected to a first plate line, the second gate conductor layer is connected to a second plate line, and the third gate conductor layer is connected to a word line. In the page erase operation, the hole group in the channel semiconductor layer is extracted from one or both of the first impurity layer and the second impurity layer by lowering the second plate line from a first voltage to a second voltage at a first time, raising the first plate line from a third voltage to a fourth voltage and raising a voltage of the word line from a fifth voltage to a sixth voltage at a second time, and returning the second plate line from the second voltage to the first voltage at a third time. The voltage of the channel semiconductor layer, to which the first plate line and the word line are capacitively coupled, is lowered to the second data holding voltage by returning the first plate line from the fourth voltage to the third voltage and returning the voltage of the word line from the sixth voltage to the fifth voltage at a fourth time (first invention).

In the first invention described above, one or both of the first plate line and the second plate line of the memory cells arrayed in the row direction and the column direction are disposed to be shared by the adjacent memory cells (second invention).

In the first invention described above, one or both of the first voltage and the fifth voltage are a ground voltage (third invention).

In the third invention described above, the second voltage is a negative voltage lower than the ground voltage (fourth invention).

In the first invention described above, a total capacitance of a first gate capacitance between the first gate conductor layer and the channel semiconductor layer and a second gate capacitance between the second gate conductor layer and the channel semiconductor layer is larger than a third gate capacitance between the third gate conductor layer and the channel semiconductor layer (fifth invention).

In the first invention described above, when viewed from an axial direction of the semiconductor base, the first gate conductor layer and the second gate conductor layer are opposite and separate from each other while surrounding the first gate insulating layer (sixth invention).

In the first invention described above, the impact ionization occurs inside the channel semiconductor layer between the first gate conductor layer and the third gate conductor layer, and generates the hole group inside the channel semiconductor layer (seventh invention).

In the first invention described above, the source line is separated every memory cells arrayed in the column direction, and is arranged parallel to the word line, the first plate line, and the second plate line (eighth invention).

In the first invention described above, in an all-page erase operation, an all-page selection signal is input to a row decoder circuit, and all the pages are selected and erased (ninth invention).

In the first invention described above, in the page erase operation, a fixed voltage is applied as a voltage of the source line and the bit line (tenth invention).

To solve the above-described problems, a memory device according to the present invention is a memory device in which a page is composed of a plurality of memory cells arrayed on a substrate in a row direction, and a plurality of pages are arrayed in a column direction. Each of the memory cells included in each of the pages includes: a semiconductor base standing on the substrate in a vertical direction relative to the substrate or extending on the substrate in a horizontal direction relative to the substrate; a first impurity layer and a second impurity layer at two ends of the semiconductor base; a first gate insulating layer surrounding a side surface of the semiconductor base between the first impurity layer and the second impurity layer, the first gate insulating layer being in contact with or proximate to the first impurity layer; a second gate insulating layer surrounding a portion or all of the side surface of the semiconductor base, being connected to the first gate insulating layer, and being in contact with or proximate to the second impurity layer; a first gate conductor layer and a second gate conductor layer covering two opposite side surfaces of the second gate insulating layer while being separate from each other; a third gate conductor layer covering the first gate insulating layer; and a channel semiconductor layer of the semiconductor base covered with the first gate insulating layer and the second gate insulating layer. A voltage applied to the first gate conductor layer, the second gate conductor layer, the third gate conductor layer, the first impurity layer, and the second impurity layer is controlled to form a hole group by impact ionization inside the channel semiconductor layer, and the hole group is held. In a page write operation, a voltage of the channel semiconductor layer is set to a first data holding voltage that is higher than a voltage of one or both of the first impurity layer and the second impurity layer. In a page erase operation, a voltage applied to the first impurity layer, the second impurity layer, the first gate conductor layer, the second gate conductor layer, and the third gate conductor layer is controlled to extract the hole group from one or both of the first impurity layer and the second impurity layer, and the voltage of the channel semiconductor layer is set to a second data holding voltage that is lower than the first data holding voltage. Of the memory cell, the first impurity layer is connected to a source line, the second impurity layer is connected to a bit line, the first gate conductor layer is connected to a first plate line, the second gate conductor layer is connected to a second plate line, and the third gate conductor layer is connected to a word line. In the page erase operation, the hole group in the channel semiconductor layer is extracted from one or both of the first impurity layer and the second impurity layer by lowering the second plate line from a first voltage to a second voltage at a first time, raising the first plate line from a third voltage to a fourth voltage and raising a voltage of the word line from a fifth voltage to a sixth voltage at a second time, and returning the second plate line from the second voltage to the first voltage at a third time. The voltage of the channel semiconductor layer, to which the first plate line and the word line are capacitively coupled, is lowered to the second data holding voltage by returning the first plate line from the fourth voltage to the third voltage and returning the voltage of the word line from the sixth voltage to the fifth voltage at a fourth time (eleventh invention).

In the eleventh invention described above, one or both of the first plate line and the second plate line of the memory cells arrayed in the row direction and the column direction are disposed to be shared by the adjacent memory cells (twelfth invention).

In the eleventh invention described above, one or both of the first voltage and the fifth voltage are a ground voltage (thirteenth invention).

In the thirteenth invention described above, the second voltage is a negative voltage lower than the ground voltage (fourteenth invention).

In the eleventh invention described above, a total capacitance of a first gate capacitance between the first gate conductor layer and the channel semiconductor layer and a second gate capacitance between the second gate conductor layer and the channel semiconductor layer is larger than a third gate capacitance between the third gate conductor layer and the channel semiconductor layer (fifteenth invention).

In the eleventh invention described above, when viewed from an axial direction of the semiconductor base, the first gate conductor layer and the second gate conductor layer are opposite and separate from each other while surrounding the second gate insulating layer (sixteenth invention).

In the eleventh invention described above, the impact ionization occurs inside the channel semiconductor layer between the first gate conductor layer and the third gate conductor layer, and generates the hole group inside the channel semiconductor layer (seventeenth invention).

In the eleventh invention described above, the source line is separated every memory cells arrayed in the column direction, and is arranged parallel to the word line, the first plate line, and the second plate line (eighteenth invention).

In the eleventh invention described above, in an all-page erase operation, an all-page selection signal is input to a row decoder circuit, and all the pages are selected and erased (nineteenth invention).

In the eleventh invention described above, in the page erase operation, a fixed voltage is applied as a voltage of the source line and the bit line (twentieth invention).

BRIEF DESCRIPTION OF THE DRAWINGS

FIGS. 4BA, 4BB, 4BC, and 4BD are diagrams for describing the readout operation mechanism of the dynamic flash memory cell according to the first embodiment.

FIGS. 9A, 9B, and 9C are diagrams for describing a readout operation of the DRAM memory cell having no capacitor according to the related art.

DETAILED DESCRIPTION OF THE PREFERRED EMBODIMENTS

Hereinafter, embodiments of a memory device using a semiconductor element (hereinafter referred to as a dynamic flash memory) according to the present invention will be described with reference to the drawings.

First Embodiment

Using FIGS. 1A to 4BD, the structure and operation mechanism of a dynamic flash memory cell according to a first embodiment will be described. Using FIGS. 1A and 1B, the structure of the dynamic flash memory cell will be described. A data erase mechanism will be described using FIGS. 2A to 2C, a data write mechanism will be described using FIGS. 3A to 3C, and a data readout mechanism will be described using FIGS. 4AA and 4BD.

Figure 1B:
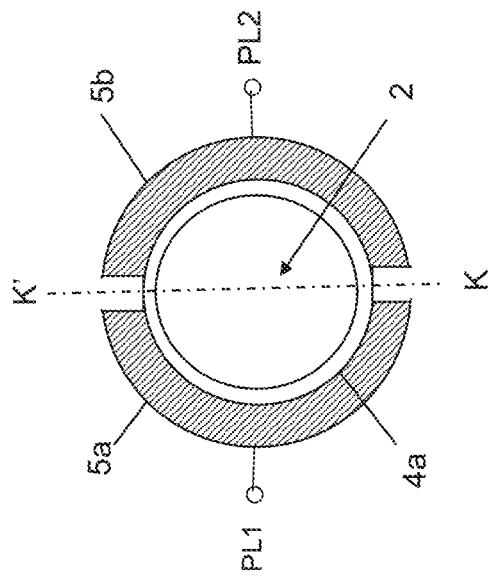
FIGS. 1A and 1B are diagrams illustrating the structure of a dynamic flash memory cell according to a first embodiment.
Figure 1A:
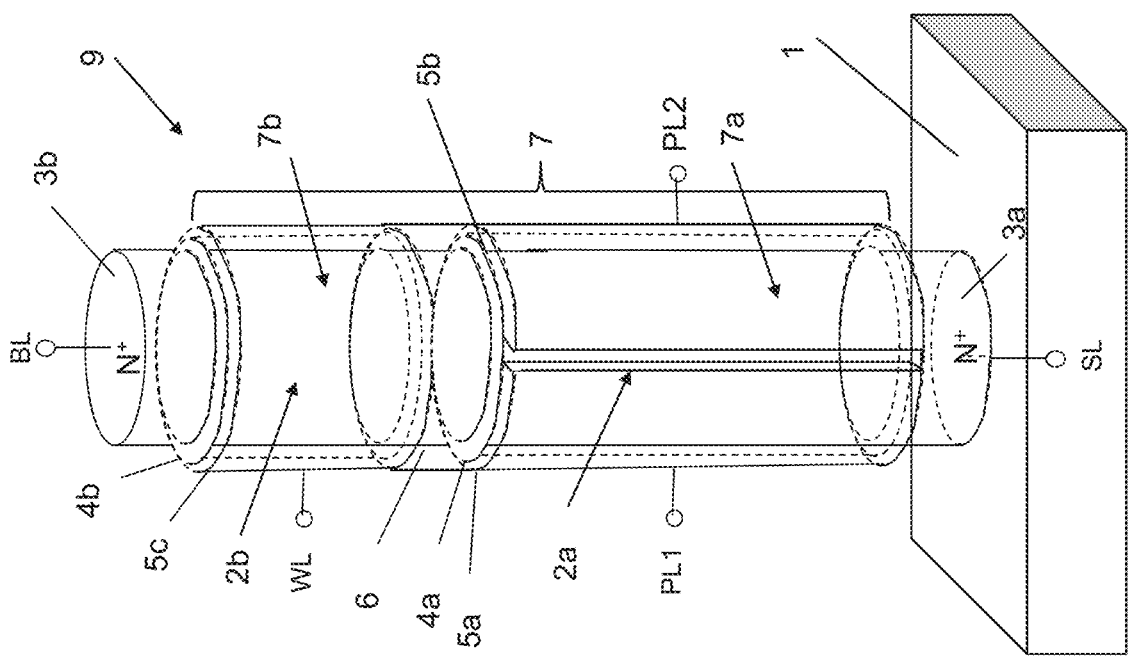

FIGS. 1A and 1B illustrate the structure of a dynamic flash memory cell 9 according to the first embodiment of the present invention. FIG. 1A is a perspective view, and FIG. 1B is a cross-sectional view cut horizontally at first and second gate conductor layers 5a and 5b. At top and bottom positions in a silicon semiconductor column 2 with P-type or i-type (intrinsic type) conductivity (hereinafter the silicon semiconductor column is referred to as "Si column") (which is an example of a "semiconductor base" in the claims), formed on a substrate 1, N$^+$ layers 3a and 3b (which are an example of a "first impurity layer" and a "second impurity layer" in the claims), one serving as a source while the other serving as a drain, are formed. The portion of the Si column 2 between the N$^+$ layers 3a and 3b serving as the source and the drain is a channel region 7 (which is an example of a "channel semiconductor layer" in the claims). A first gate insulating layer 4a (which is an example of a "first gate insulating layer" in the claims) and a second gate insulating layer 4b (which is an example of a "second gate insulating layer" in the claims) are formed so as to surround the channel region 7. The first gate insulating layer 4a and the second gate insulating layer 4b are respectively in contact with or proximate to the N$^+$ layers 3a and 3b serving as the source and the drain. There are the first gate conductor layer 5a (which is an example of a "first gate conductor layer" in the claims) and the second gate conductor layer 5b (which is an example of a "second gate conductor layer" in the claims) surrounding the first gate insulating layer 4a. Moreover, a third gate conductor layer 5c (which is an example of a "third gate conductor layer" in the claims) is formed so as to surround the second gate insulating layer 4b. The first gate conductor layer 5a and the second gate conductor layer 5b are separated from the third gate conductor layer 5c via an insulating layer 6 (which is an example of a "first insulating layer" in the claims). The channel region 7 between the N$^+$ layers 3a and 3b includes a first channel Si region 7a surrounded by the first gate insulating layer 4a and a second channel Si region 7b surrounded by the second gate insulating layer 4b. Accordingly, the dynamic flash memory cell 9 including the N+ layers 3a and 3b, which serve as the source and the drain, the channel region 7, the first gate insulating layer 4a, the second gate insulating layer 4b, the first gate conductor layer 5a, the second gate conductor layer 5b, and the third gate conductor layer 5c is formed. Then, the N+ layer 3a serving as the source is connected to a source line SL (which is an example of a "source line" in the claims); the N+ layer 3b serving as the drain is connected to a bit line BL (which is an example of a "bit line" in the claims); the first gate conductor layer 5a is connected to a first plate line PL1 (which is an example of a "first plate line" in the claims); the second gate conductor layer 5b is connected to a second plate line PL2 (which is an example of a "second plate line" in the claims); and the third gate conductor layer 5c is connected to a word line WL (which is an example of a "word line" in the claims). It is desirable to have a structure making the sum total of the gate capacitances of the first gate conductor layer 5a and the second gate conductor layer 5b to which the first plate line PL1 and the second plate line PL2 are connected larger than the gate capacitance of the third gate conductor layer 5c to which the word line WL is connected.

In FIGS. 1A and 1B, the gate lengths of the first gate conductor layer 5a and the second gate conductor layer 5b are made longer than the gate length of the third gate conductor layer 5c so that the sum total of the gate capacitances of the first gate conductor layer 5a and the second gate conductor layer 5b to which the first plate line PL1 and the second plate line PL2 are connected will be larger than the gate capacitance of the third gate conductor layer 5c to which the word line WL is connected. However, alternatively, instead of making the gate lengths of the first gate conductor layer 5a and the second gate conductor layer 5b longer than the gate length of the third gate conductor layer 5c, the film thickness of each gate insulating layer may be changed to make the film thickness of the gate insulating film of the first gate insulating layer 4a thinner than the film thickness of the gate insulating film of the second gate insulating layer 4b. Moreover, the dielectric constant of the material of each gate insulating layer may be changed to make the dielectric constant of the gate insulating film of the first gate insulating layer 4a higher than the dielectric constant of the gate insulating film of the second gate insulating layer 4b. Furthermore, any of the length of the gate conductor layers 5a, 5b, and 5c, and the film thickness and the dielectric constant of the gate insulating layers 4a and 4b may be combined to make the sum total of the gate capacitances of the first gate conductor layer 5a and the second gate conductor layer 5b to which the first plate line PL1 and the second plate line PL2 are connected larger than the gate capacitance of the third gate conductor layer 5c to which the word line WL is connected.

Note that the dynamic flash memory cell 9 may be horizontal to the substrate 1. In this case, K-K' line connecting slits at two ends of the first gate conductor layer 5a and the second gate conductor layer 5b illustrated in FIG. 1B may be parallel to or perpendicular to the substrate 1. The substrate 1 may be formed of a silicon on insulator (SOI), Si or other semiconductor materials consisting of a single layer or a plurality of layers. The substrate 1 may be a well layer consisting of a single N or P layer or of plural N or P layers. In FIG. 1B, the circumferential lengths (outer circumferential lengths) of the first gate conductor layer 5a and the second gate conductor layer 5b surrounding the first gate insulating layer 4a may be the same or different.

Figure 2A:
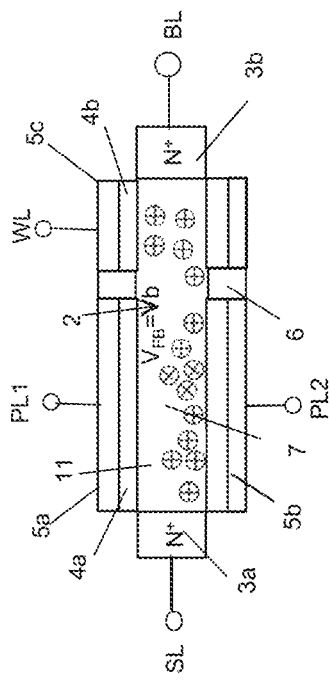
FIGS. 2A, 2B, and 2C are diagrams for describing an erase operation mechanism of the dynamic flash memory cell according to the first embodiment.
Figure 2B:
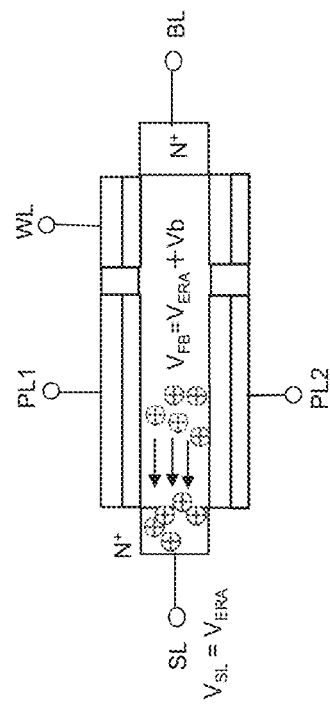
Figure 2C:
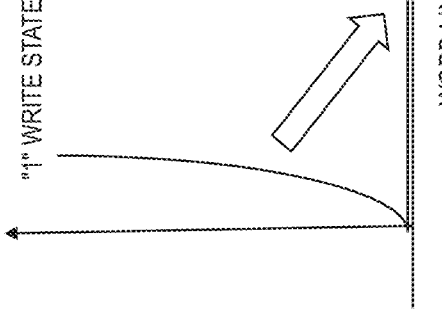

An erase operation mechanism will be described using FIGS. 2A to 2C. The channel region 7 between the N+ layers 3a and 3b is electrically separated from the substrate 1 and is a floating body. FIG. 2A illustrates a state in which a hole group 11 generated by impact ionization in the previous cycle is stored in the channel region 7 prior to an erase operation. Here, by lowering the voltage of the second plate line PL2 below the voltage of the first plate line PL1, the hole group 11 is stored in the channel region 7 on the side of the second gate conductor layer 5b connected to the second plate line PL2. Then, in the erase operation, the voltage of the source line SL is set to a negative voltage $V_{ERA}$, as illustrated in FIG. 2B. Here, $V_{ERA}$ is −3 V, for example. As a result, regardless of the value of the initial potential of the channel region 7, the PN junction between the N+ layer 3a serving as the source to which the source line SL is connected and the channel region 7 becomes forward biased. As a result, the hole group 11 stored in the channel region 7, generated by impact ionization in the previous cycle, is sucked into the N+ layer 3a of the source portion, and the potential $V_{FB}$ of the channel region 7 becomes $V_{FB}=V_{ERA}+Vb$. Here, Vb is the built-in voltage of the PN junction and is about 0.7 V. Therefore, when $V_{ERA}=-3$ V, the potential of the channel region 7 is −2.3 V. This value is the potential state of the channel region 7 in the erase state. Therefore, when the potential of the channel region 7 of the floating body becomes negative, the threshold voltage of the N-channel MOS transistor of the dynamic flash memory cell 9 is increased due to a substrate biasing effect. This results in a higher threshold voltage for the upper gate conductor layer 5c to which this word line WL is connected, as illustrated in FIG. 2C. The erase state of this channel region 7 is logic storage data "0". Note that the condition of a voltage applied to the bit line BL, the source line SL, the word line WL, the first plate line PL1, and the second plate line PL2 described above is one example for performing an erase operation, and may be other voltage conditions under which an erase operation can be performed.

Figure 3C:
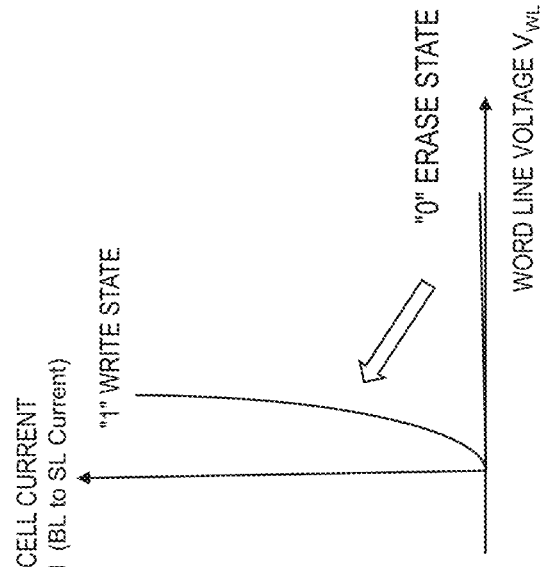
FIGS. 3A, 3B, and 3C are diagrams for describing a write operation mechanism of the dynamic flash memory cell according to the first embodiment.
Figure 3A:
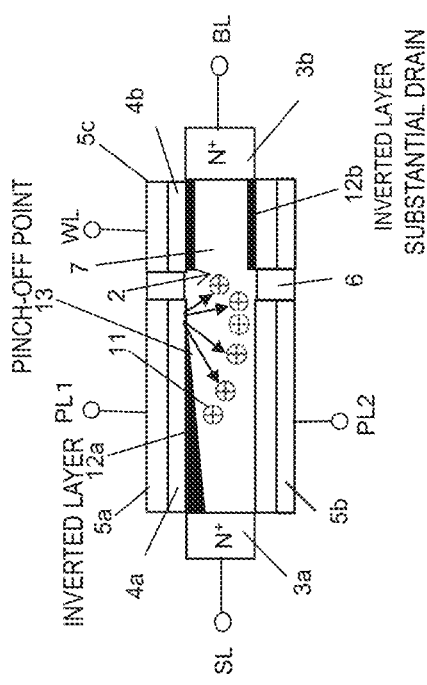
Figure 3B:
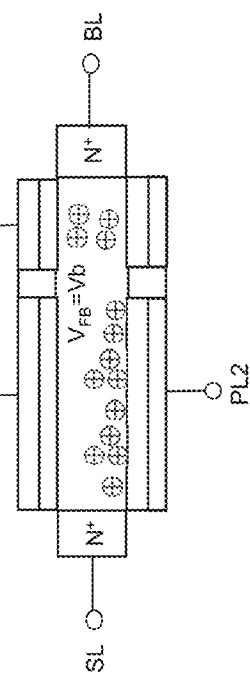

FIGS. 3A to 3C illustrate a page write operation (which is an example of a "page write operation" in the claims) of the dynamic flash memory cell 9 according to the first embodiment of the present invention. As illustrated in FIG. 3A, for example, 0 V is input to the N+ layer 3a to which the source line SL is connected; for example, 3 V is input to the N+ layer 3b to which the bit line BL is connected; for example, 1.5 V is input to the first gate conductor layer 5a to which the first plate line PL1 is connected; and, for example, 2.0 V is input to the upper gate conductor layer 5c to which the word line WL is connected. As a result, as illustrated in FIG. 3A, an inverted layer 12a is formed inside the first gate conductor layer 5a to which the first plate line PL1 is connected. At this time, for example, 0 V, which is the ground voltage, is applied to the second gate conductor layer 5b to which the second plate line PL2 is connected. As a result, a first N-channel MOS transistor region having the first gate conductor layer 5a operates in a saturated range. Therefore, there is a pinch-off point 13 in the inverted layer 12a inside the first gate conductor layer 5a to which the first plate line PL1 is connected. Also, no inverted layer is formed inside the second gate conductor layer 5b to which the second plate line PL2 is connected.

In contrast, a third N-channel MOS transistor region having the third gate conductor layer 5c to which the word line WL is connected is operated in a linear range. As a result, there is no pinch-off point inside the third gate conductor layer 5c to which the word line WL is connected, and an inverted layer 12b is formed on the entire surface. The inverted layer 12b formed on the entire surface inside the third gate conductor layer 5c to which the word line WL is connected acts as a substantial drain of the first N-channel MOS transistor region having the first gate conductor layer 5a. As a result, the electric field is maximized in the boundary region (first boundary region) of the channel region 7 between the first N-channel MOS transistor region having the first gate conductor layer 5a and the third N-channel MOS transistor region having the third gate conductor layer 5c, which are connected in series, and impact ionization occurs in this region. This phenomenon is referred to as the source-side impact ionization because this region is the source-side region seen from the third N-channel MOS transistor region having the third gate conductor layer 5c to which the word line WL is connected. This source-side impact ionization causes electrons to flow from the $N^+$ layer 3a to which the source line SL is connected towards the $N^+$ layer 3b to which the bit line BL is connected. The accelerated electrons collide with the lattice Si atoms and their kinetic energy generates electron-hole pairs. Most of the generated electrons flow into the $N^+$ layer 3b to which the bit line BL is connected. The generated hole group 11 also collects and accumulates in the channel region 7 on the side of a second N-channel MOS transistor region having the second gate conductor layer 5b where no inverted layer is formed, as illustrated in FIG. 3B, since the ground voltage, such as 0 V, is applied to the second plate line PL2.

Then, as illustrated in FIG. 3B, the generated hole group 11 is a multitude of carriers in the channel region 7 and charges the channel region 7 to a positive bias. Since the $N^+$ layer 3a to which the source line SL is connected is 0 V, the channel region 7 is charged to the built-in voltage Vb (about 0.7 V) of the PN junction between the $N^+$ layer 3a to which the source line SL is connected and the channel region 7. When the channel region 7 is charged to a positive bias, the threshold voltage of the first N-channel MOS transistor region and the third N-channel MOS transistor region is lowered due to a substrate biasing effect. This lowers the threshold voltage of the N-channel MOS transistor region of the second channel region 7b to which the word line WL is connected, as illustrated in FIG. 3C. The write state of this channel region 7 serves as a first data holding voltage (which is an example of a "first data holding voltage" in the claims) and is assigned to logic storage data "1".

In a write operation, electron-hole pairs may be generated by impact ionization or gate induced drain leakage (GIDL) current in a second boundary region between the first impurity layer ($N^+$ layer 3a) and the channel region 7 or in a third boundary region between the second impurity layer ($N^+$ layer 3b) and the channel region 7, instead of in the first boundary region, and the channel region 7 may be charged with the generated hole group 11. Note that the condition of a voltage applied to the bit line BL, the source line SL, the word line WL, and the plate lines PL1 and PL2 described above is one example for performing a write operation, and may be other operating conditions under which a write operation can be performed.

In addition, when writing "1", electron-hole pairs may be generated using a GIDL current (see E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006), and the interior of a floating body FB may be filled with the generated hole group.

Figure 4A:
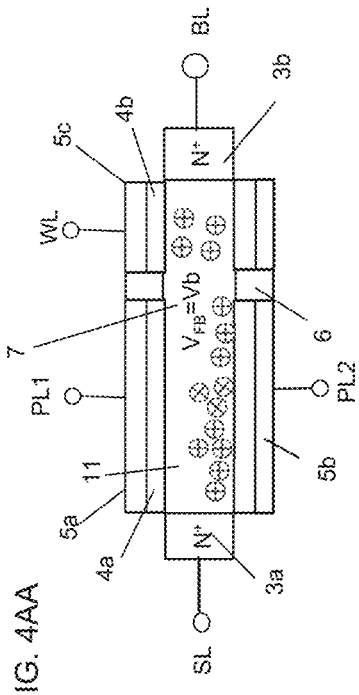
FIGS. 4AA, 4AB, and 4AC are diagrams for describing a readout operation mechanism of the dynamic flash memory cell according to the first embodiment.
Figure 4A:
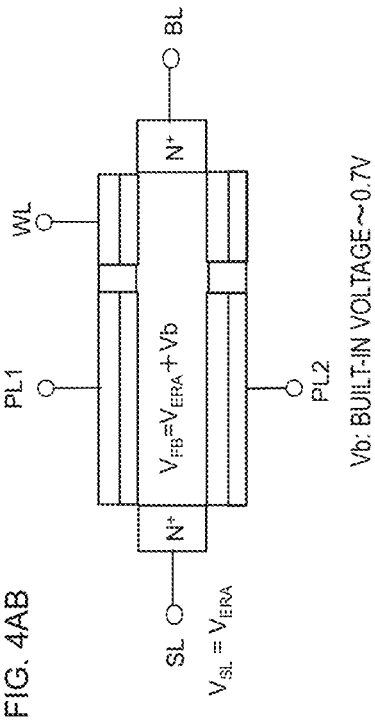
Figure 4A:
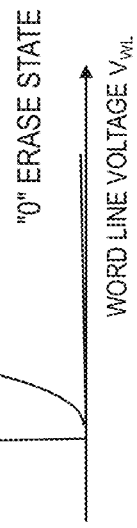

The readout operation of the dynamic flash memory cell 9 according to the first embodiment of the present invention, and the memory cell structure related thereto will be described using FIGS. 4AA to 4BD. A readout operation of the dynamic flash memory cell 9 will be described using FIGS. 4AA to 4AC. As illustrated in FIG. 4AA, when the channel region 7 is charged to the built-in voltage Vb (about 0.7 V), the threshold voltage of the N-channel MOS transistor region is lowered due to a substrate biasing effect. This state is assigned to logic storage data "1". As illustrated in FIG. 4AB, if the memory block to be selected before writing is performed is in the erase state "0" in advance, the channel region 7 has the floating voltage $V_{FB}=V_{ERA}+Vb$. The write state "1" is stored randomly by a write operation. As a result, the logic storage data of logic "0" and "1" is generated for the word line WL. As illustrated in FIG. 4AC, readout is performed with a sense amplifier by using the difference between two threshold voltages for the word line WL. In the logic "0" data readout, by setting a voltage applied to the first plate line PL1 to be higher than the threshold voltage at the time of logic storage data "1" and lower than the threshold voltage at the time of logic storage data "0", the characteristic that no current flows even if the word line WL voltage is increased is obtained, as illustrated in FIG. 4AC.

Using FIGS. 4BA to 4BD, the magnitude relationship of the gate capacitances of the three gate conductor layers, that is, the first gate conductor layer 5a, the second gate conductor layer 5b, and the third gate conductor layer 5c, in a readout operation of the dynamic flash memory cell 9 according to the first embodiment of the present invention, and operations related thereto will be described. It is desirable that the gate capacitance of the third gate conductor layer 5c to which the word line WL is connected be designed to be smaller than the gate capacitance combining the capacitance of the first gate conductor layer 5a to which the first plate line PL1 is connected and the capacitance of the second gate conductor layer 5b to which the second plate line PL2 is connected. As illustrated in FIG. 4BA, the gate capacitance of the third gate conductor layer 5c to which the word line WL is connected is made smaller than the gate capacitance combining the capacitance of the first gate conductor layer 5a to which the first plate line PL1 is connected and the capacitance of the second gate conductor layer 5b to which the second plate line PL2 is connected by making the vertical length of the first gate conductor layer 5a and the second gate conductor layer 5b to which the first plate line PL1 and the second plate line PL2 are connected longer than the vertical length of the third gate conductor layer 5c to which the word line WL is connected. FIG. 4BB illustrates an equivalent circuit of one cell of the dynamic flash memory illustrated in FIG. 4BA. FIG. 4BC illustrates the coupling capacitance relationship of the dynamic flash memory. Here, $C_{WL}$ is the capacitance of the third gate conductor layer 5c; $C_{PL}$ is the capacitance combining the capacitance $C_{PL1}$ of the first gate conductor layer 5a and the capacitance $C_{PL2}$ of the second gate conductor layer 5b; $C_{BL}$ is the capacitance of the PN junction between the $N^+$ layer 3b serving as the drain and the second channel region 7b; and $C_{SL}$ is the capacitance of the PN junction between the $N^+$ layer 3a serving as the source and the first channel region 7a. As illustrated in FIG. 4BD, when the voltage of the word line WL swings, this operation affects the channel region 7 as noise. At this time, the potential fluctuation $\Delta V_{FB}$ of the channel region 7 is:

$$\Delta V_{FB}=C_{WL}/(C_{PL}+C_{WL}+C_{BL}+C_{SL})\times V_{ReadWL} \qquad (1)$$

Here, $V_{ReadWL}$ is the amplitude potential at the time of reading the word line WL. As is clear from Formula (1), if the contribution rate of $C_{WL}$ is reduced compared to the overall capacitance $C_{PL}+C_{WL}+C_{BL}+C_{SL}$ of the channel region 7, $\Delta V_{FB}$ becomes smaller. Since $C_{BL}+C_{SL}$ is the capacitance of the PN junctions, in order to increase the capacitance, for example, the diameter of the Si column 2 can be increased. However, this is not desirable for memory cell miniaturization. In contrast, by making the axial length of the first gate conductor layer 5a to which the first plate line PL1 is connected and the second gate conductor layer 5b to which the second plate line PL2 is connected yet longer than the axial length of the third gate conductor layer 5c to which the word line WL is connected, $\Delta V_{FB}$ can be made yet smaller without dropping the degree of integration of the memory cell when viewed in plan.

Note that the condition of a voltage applied to the bit line BL, the source line SL, the word line WL, the first plate line PL1, and the second plate line PL2 described above and the potential of the floating body are one example for performing a readout operation, and may be other operating conditions under which a readout operation can be performed.

Using FIGS. 5A and 5B, a page erase operation (which is an example of a "page erase operation" in the claims) of not inputting a positive bias or negative bias pulse to one or both of the bit line BL and the source line SL of the dynamic flash memory cell 9 according to the first embodiment of the present invention will be described. When a page erase operation begins, at a first time T1 (which is an example of a "first time" in the claims), the voltage of the second plate line PL2 drops from a first voltage V1 (which is an example of a "first voltage" in the claims) to a second voltage V2 (which is an example of a "second voltage" in the claims). Here, the first voltage V1 is 0 V, for example, which is the ground voltage Vss, and the second voltage V2 is −2.0 V, for example, which is a negative bias. As a result, the threshold voltage of the N-channel MOS transistor regions of the first gate conductor layer 5a, the second gate conductor layer 5b, and the third gate conductor layer 5c to which the first plate line PL1, the second plate line PL2, and the word line WL are respectively connected is increased. Therefore, in the memory cell 9 in the "1" write state, which stores the hole group 11 in the channel region 7, the inverted layer 12a formed directly below the first gate conductor layer 5a disappears.

Figure 5A:
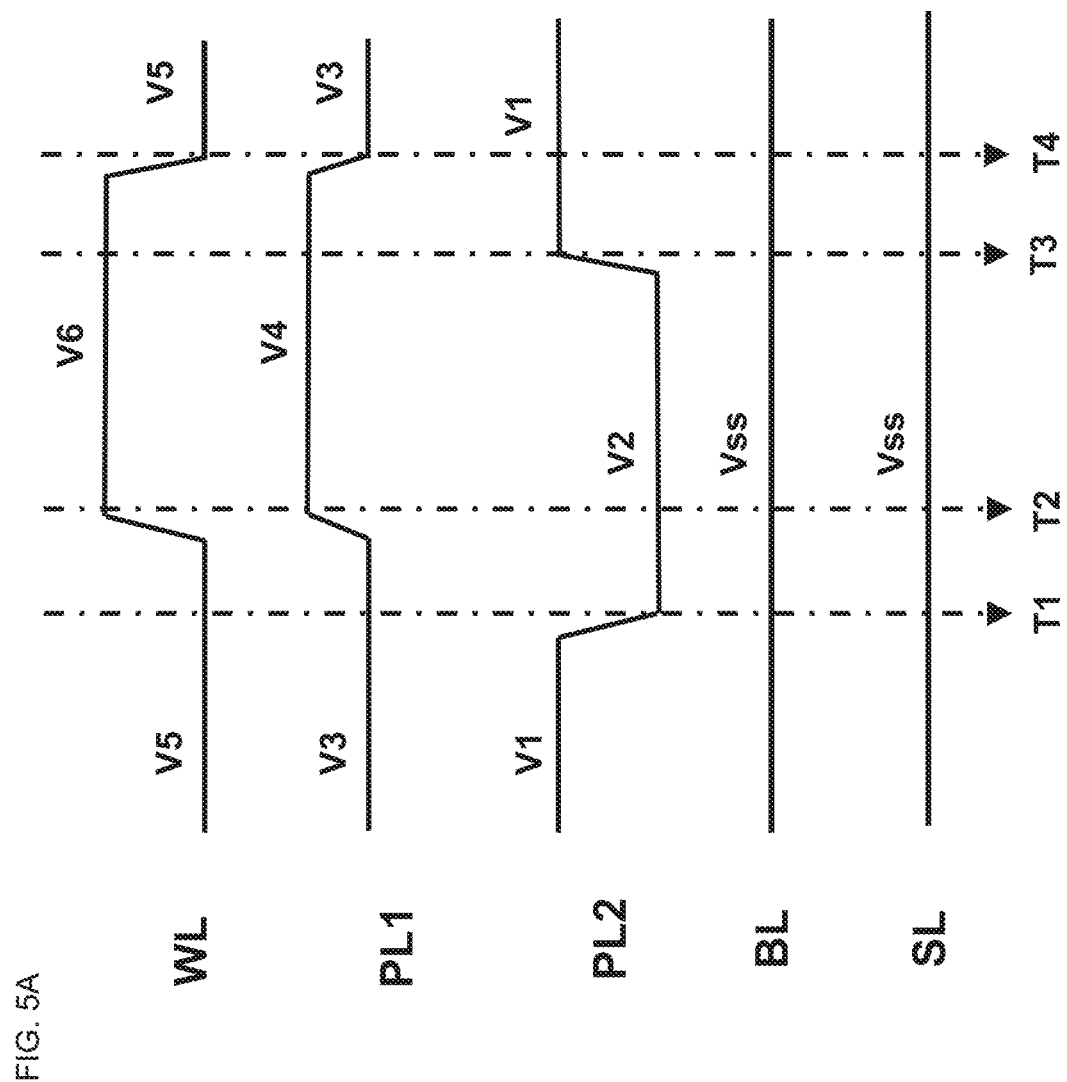
FIG. 5A is a diagram for describing a page erase operation mechanism of not inputting a positive or negative bias pulse to a bit line and a source line of the dynamic flash memory cell according to the first embodiment.
Figure 5B:
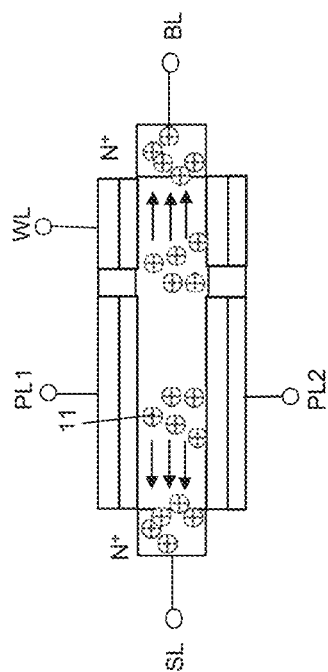
FIG. 5B is a diagram for describing the page erase operation mechanism of not inputting a positive or negative bias pulse to the bit line and the source line of the dynamic flash memory cell according to the first embodiment.

At a second time T2 (which is an example of a "second time" in the claims) illustrated in FIG. 5A, the voltage of the first plate line PL1 rises from a third voltage V3 (which is an example of a "third voltage" in the claims) to a fourth voltage V4 (which is an example of a "fourth voltage" in the claims), and the voltage of the word line WL rises from a fifth voltage V5 (which is an example of a "fifth voltage" in the claims) to a sixth voltage V6 (which is an example of a "sixth voltage" in the claims). Here, the third voltage V3, the fourth voltage V4, the fifth voltage V5, and the sixth voltage V6 are 0.8 V, 2.0 V, 0 V or the ground voltage, and 2.0 V, respectively, for example. Therefore, as the voltages of the plate line PL1 and the word line WL, which are capacitively coupled to the channel region 7 in the floating state, rise, the floating state voltage of the channel region 7 is pushed up. Note that the second time T2 is a time having a width, and either the first plate line PL1 or the word line WL may rise first.

By returning the voltage of the second plate line PL2 from the second voltage V2 to the first voltage V1 at a third time T3 (which is an example of a "third time" in the claims) illustrated in FIG. 5A, the floating state voltage of the channel region 7 is further pushed up with the rise of the voltage of the plate line PL2, which is capacitively coupled to the channel region 7 in the floating state. As a result, the PN junction between the channel region 7 and the first impurity layer 3a and the PN junction between the channel region 7 and the second impurity layer 3b are biased forward, and the hole group 11 in the channel region 7 is extracted from the first impurity layer 3a and the second impurity layer 3b, as illustrated in FIG. 5B. FIG. 5B illustrates the discharge of the hole group 11 in the channel region 7 into the first impurity layer 3a and the second impurity layer 3b by the bit line BL and the source line SL, which are set to the ground voltage in a page erase operation.

At a fourth time T4 (which is an example of a "fourth time" in the claims) illustrated in FIG. 5A, the voltage of the first plate line PL1 is returned from the fourth voltage V4 to the third voltage V3, and the voltage of the word line WL is returned from the sixth voltage V6 to the fifth voltage V5. As a result, the voltage of the channel region 7 in the floating state, to which the first plate line PL1 and the word line WL are capacitively coupled, is lowered to a second data holding voltage (which is an example of a "second data holding voltage" in the claims). In this manner, a page erase operation can be performed without inputting a positive bias or negative bias pulse to one or both of the bit line BL and the source line SL.

In FIG. 5A, in the page erase operation, a fixed voltage (an example of a "fixed voltage" in the claims) is applied as the voltage of the bit line BL and the source line SL. For example, the fixed voltage may be Vss, which is the ground voltage, Vss=0 V.

Figure 6A:
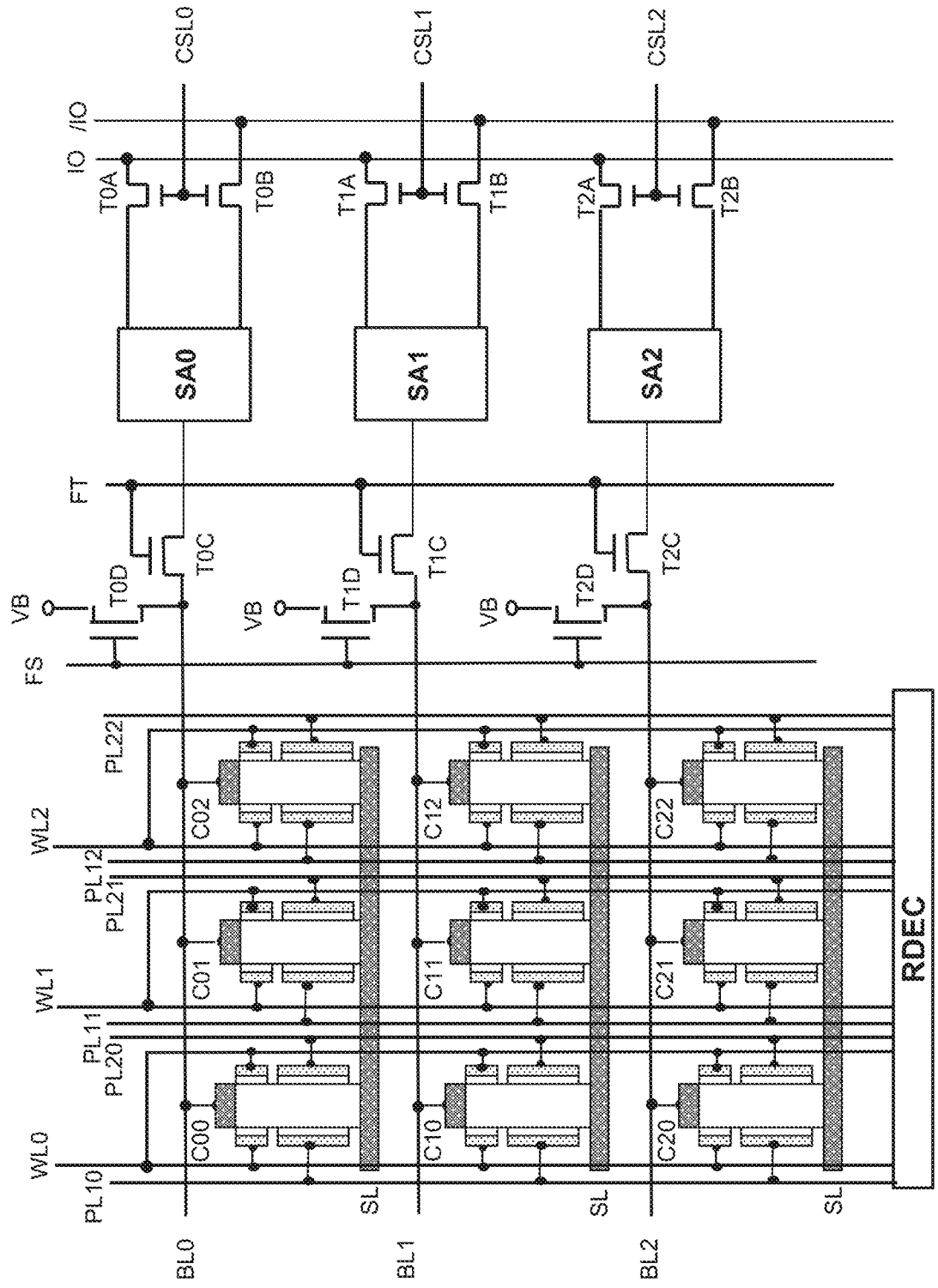
FIG. 6A is a diagram for describing the page erase operation mechanism of not inputting a positive or negative bias pulse to the bit line and the source line in a memory cell array of the dynamic flash memory cells according to the first embodiment.

Using FIGS. 6A to 6E, in a memory cell array of the dynamic flash memory cells according to the first embodiment of the present invention, a page erase operation of not inputting a positive bias or negative bias pulse to one or both of the bit line BL and the source line SL will be described. FIG. 6A illustrates three rows by three columns of memory cells C00 to C22 making up a part of a memory cell block. Each of the memory cells C00 to C22 corresponds to the memory cell 9 illustrated in FIGS. 1A and 1B. Although three rows by three columns of memory cells C00 to C22 are illustrated here, the memory cells in the actual memory cell block form an array larger than three rows by three columns. Word lines WL0 to WL2, first plate lines PL10 to PL12, second plate lines PL20 to PL22, source line SL, and bit lines BL0 to BL2 are connected to the memory cells C00 to C22. Transistors T0C to T2C having gates to which a transfer signal FT is input constitute a switch circuit. In transistors T0D to T2D having gates connected to a bit line precharge signal FS, their drains are connected to a bit line power supply VB, and their sources are connected to the bit lines BL0 to BL2. Then, the bit lines BL0 to BL2 are connected to sense amplifier circuits SA0 to SA2, respectively, via the switch circuit. Here, the sense amplifier circuits may be forced-inversion-type sense amplifier circuits. The word lines WL0 to WL2, the first plate lines PL10 to PL12, and the second plate lines PL20 to PL22 are connected to a row decoder circuit RDEC (which is an example of a "row decoder circuit" in the claims). The sense amplifier circuits SA0 to SA2 are connected to a pair of complementary input/output lines IO and/IO via corresponding transistors T0A to T2B having gates connected to column selection lines CSL0 to CSL2. Note that FIG. 6A illustrates a state in which the erase operation illustrated in FIGS. 2B and 2C is performed on the entire memory cell block, and the hole group 11 is not accumulated in the channel region 7 thereof.

Figure 6B:
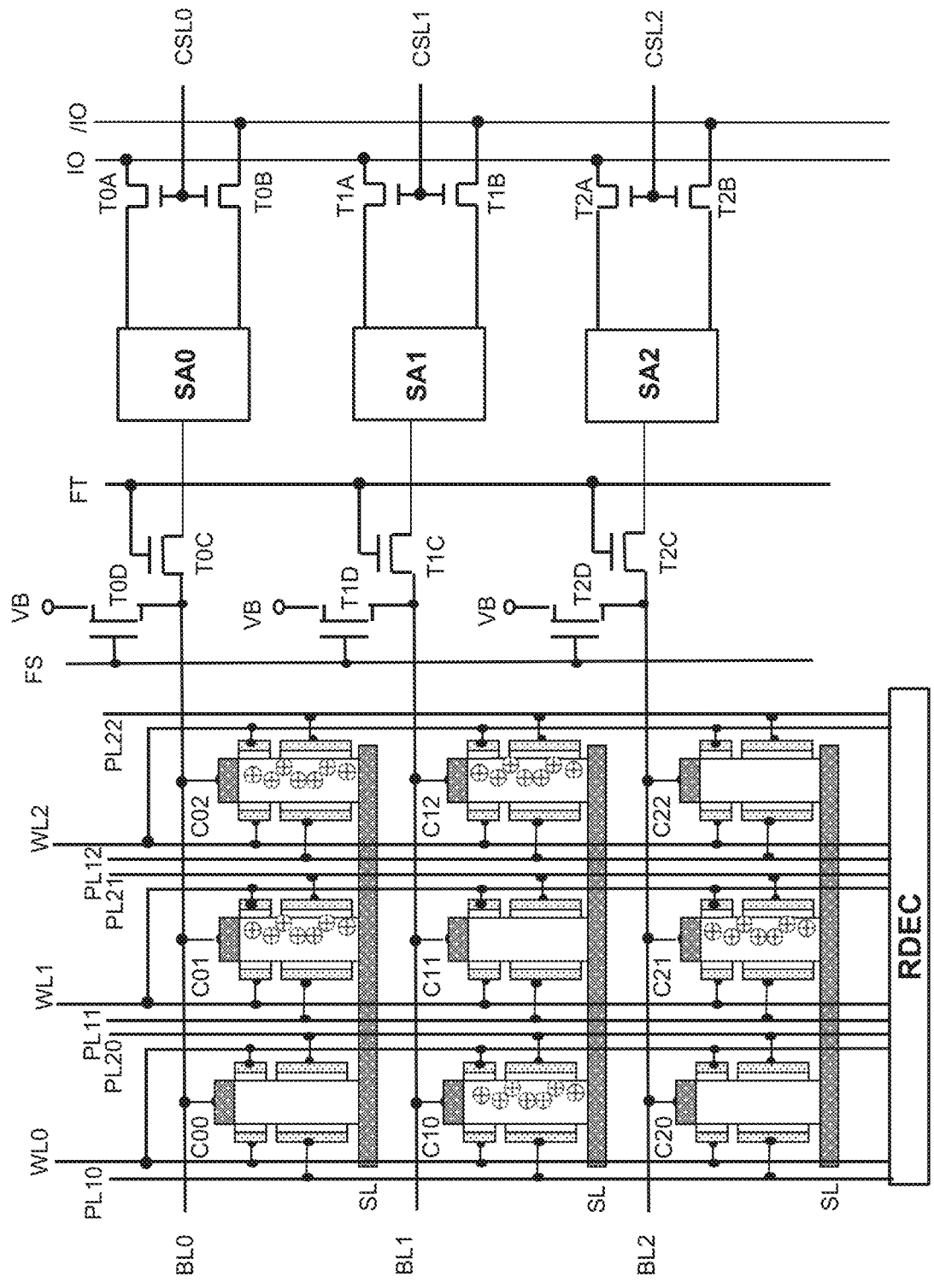
FIG. 6B is a diagram for describing the page erase operation mechanism of not inputting a positive or negative bias pulse to the bit line and the source line in the memory cell array of the dynamic flash memory cells according to the first embodiment.

FIG. 6B illustrates that at any time point, "1" is randomly written to the memory cells C10, C01, C21, C02, and C12 among the memory cells C00 to C22, and the hole group 11 is accumulated in the channel region 7 thereof.

Figure 6C:
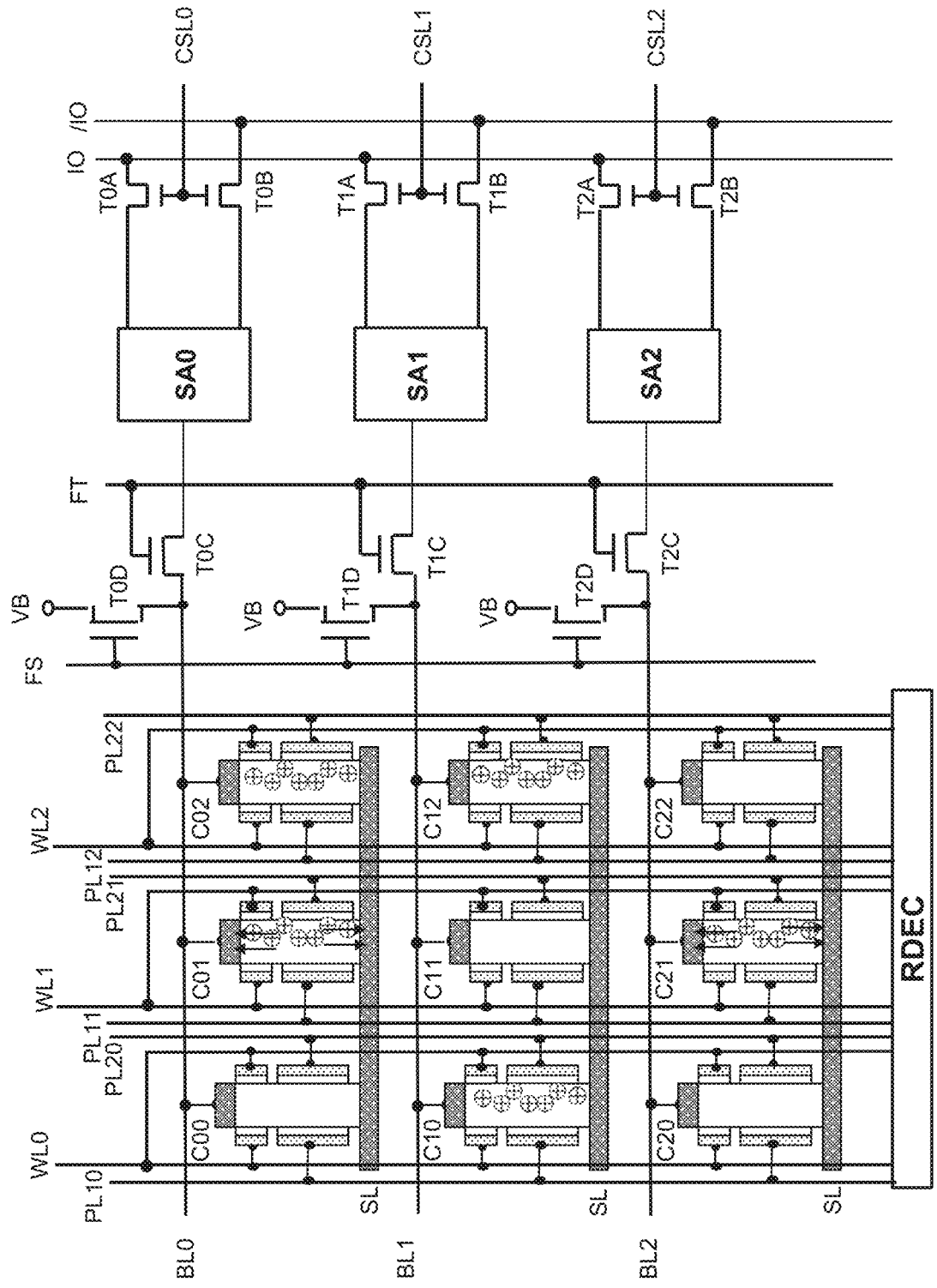
FIG. 6C is a diagram for describing the page erase operation mechanism of not inputting a positive or negative bias pulse to the bit line and the source line in the memory cell array of the dynamic flash memory cells according to the first embodiment.
Figure 6D:
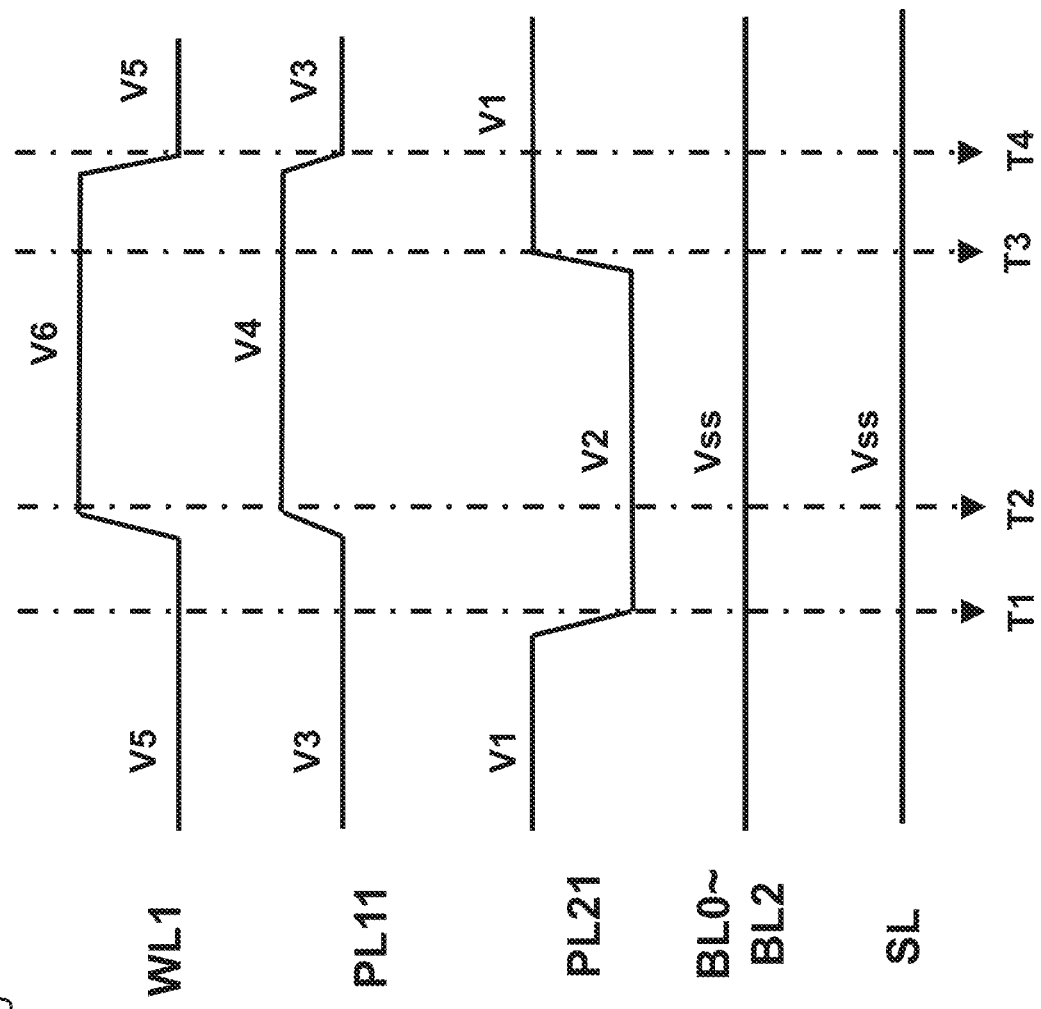
FIG. 6D is a diagram for describing the page erase operation mechanism of not inputting a positive or negative bias pulse to the bit line and the source line in the memory cell array of the dynamic flash memory cells according to the first embodiment.

Using FIGS. 6C and 6D, a page erase operation for a page (which is one example of a "page" in the claims) composed of the memory cells C01, C11, and C21 will be described. When the page erase operation begins, at the first time T1, the voltage of the second plate line PL21 drops from the first voltage V1 to the second voltage V2. Here, the first voltage V1 is 0 V, for example, which is the ground voltage Vss, and the second voltage V2 is −2.0 V, for example, which is a negative bias. As a result, the threshold voltage of the N-channel MOS transistor regions of the first gate conductor layer 5a, the second gate conductor layer 5b, and the third gate conductor layer 5c to which the first plate line PL11, the second plate line PL21, and the word line WL1 are connected rises. Accordingly, in the memory cells C01 and C21 in the "1" write state, which store the hole group 11 in the channel region 7, the inverted layer 12a formed directly below the first gate conductor layer 5a disappears.

At the second time T2, the voltage of the first plate line PL11 rises from the third voltage V3 to the fourth voltage V4, and the voltage of the word line WL1 rises from the fifth voltage V5 to the sixth voltage V6. Here, the third voltage V3, the fourth voltage V4, the fifth voltage V5, and the sixth voltage V6 are 0.8 V, 2.0 V, 0 V or the ground voltage, and 2.0 V, respectively, for example. Accordingly, as the voltages of the first plate line PL11 and the word line WL1, which are capacitively coupled to the channel region 7 in the floating state, rise, the floating state voltage of the channel region 7 is pushed up. Note that the second time T2 is a time having a width, and either the first plate line PL11 or the word line WL1 may rise first.

By returning the voltage of the second plate line PL21 from the second voltage V2 to the first voltage V1 at the third time T3, the voltage of the plate line PL21, which is capacitively coupled to the channel region 7 in the floating state, rises, and this further pushes up the floating state voltage of the channel region 7. As a result, in the memory cells C01 and C21 in the "1" write state, the PN junction between the channel region 7 and the first impurity layer 3a and the PN junction between the channel region 7 and the second impurity layer 3b are biased forward, and the hole group 11 in the channel region 7 is extracted from the first impurity layer 3a and the second impurity layer 3b, as illustrated in FIG. 6C.

At the fourth time T4, the voltage of the first plate line PL11 is returned from the fourth voltage V4 to the third voltage V3, and the voltage of the word line WL1 is returned from the sixth voltage V6 to the fifth voltage V5. As a result, the voltage of the channel region 7 in the floating state, to which the first plate line PL11 and the word line WL1 are capacitively coupled, drops, and the voltage of the channel region 7 of the memory cells C01, C11, C21 of the selected page is set to the second data holding voltage. In this manner, in the memory cell array, a page erase operation can be performed without inputting a positive bias or negative bias pulse to one or both of the bit line BL and the source line SL.

Figure 6E:
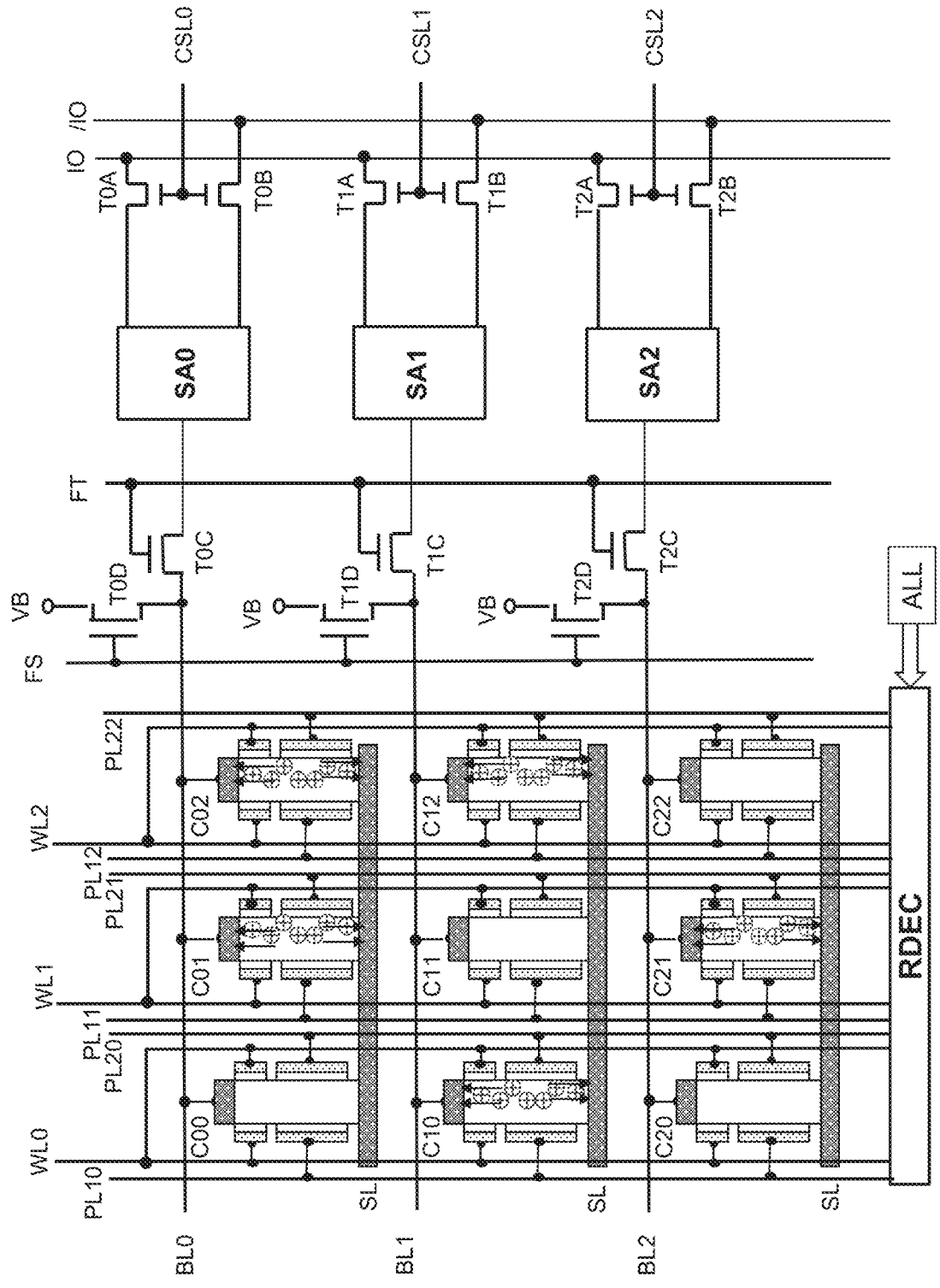
FIG. 6E is a diagram for describing the page erase operation mechanism of not inputting a positive or negative bias pulse to the bit line and the source line in the memory cell array of the dynamic flash memory cells according to the first embodiment.
Figure 7A:
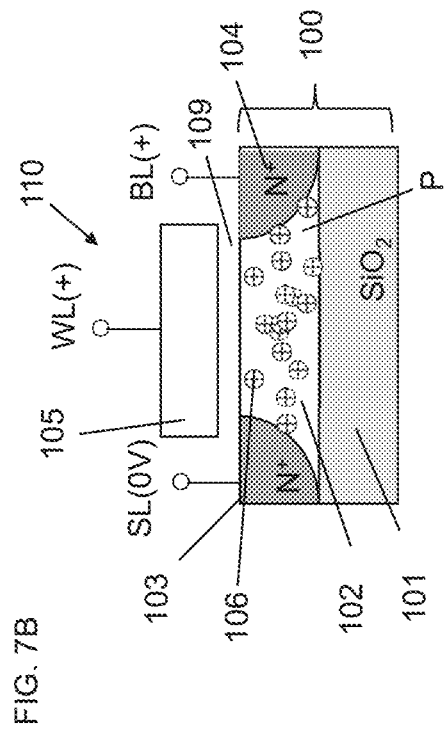
FIGS. 7A, 7B, 7C, and 7D are diagrams for describing a write operation of a DRAM memory cell having no capacitor according to the related art.
Figure 7B:
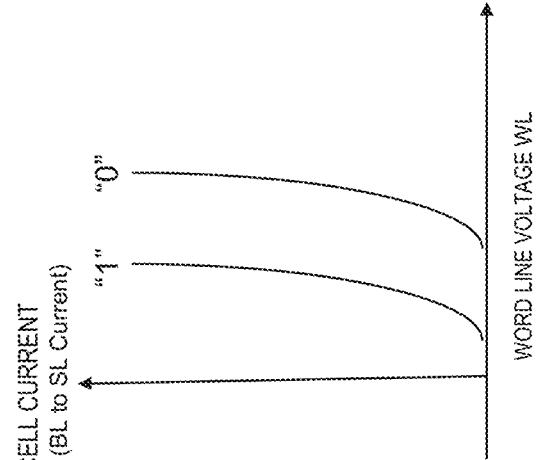
Figure 7C:
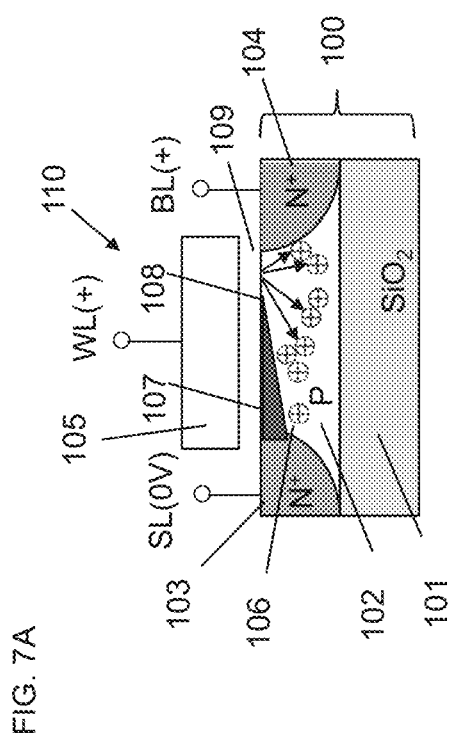
Figure 7D:
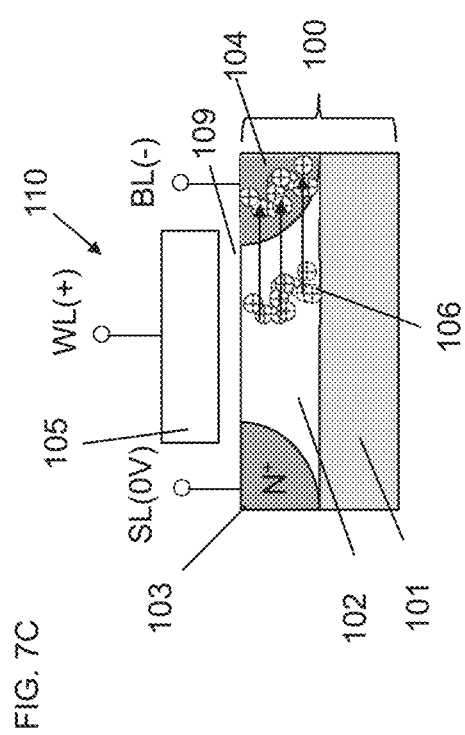
Figure 8A:
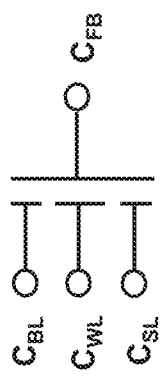
FIGS. 8A and 8B are diagram for describing an operational problem of the DRAM memory cell having no capacitor according to the related art.
Figure 8B:
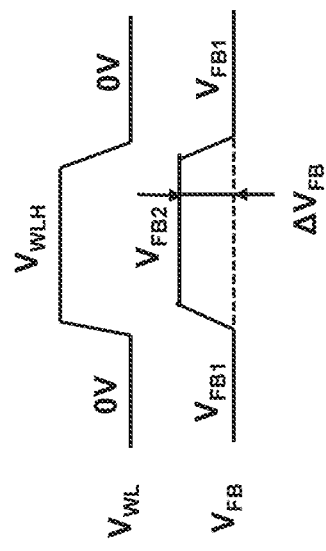

Using FIG. 6E, an all-page erase operation (which is an example of an "all-page erase operation" in the claims) for all pages will be described. FIG. 6E illustrates the case in which an all-page selection signal ALL (which is an example of an "all-page selection signal" in the claims) is input to the row decoder circuit. Here, all of the word lines WL0 to WL2, the first plate lines PL10 to PL12, and the second plate lines PL20 to PL22 in the memory cell block are selected, and an erase operation is performed for all of the memory cells C00 to C22.

Moreover, the first plate line PL1 and the second plate line PL2 may be shared by adjacent memory cells. Even with this configuration, the page erase operation of the dynamic flash memory cells according to the first embodiment of the present invention can also be executed.

Note that the source line SL parallel to the first plate line PL1, the second plate line PL2, and the word line WL0 may be arranged at a separation. Even with this configuration, the page erase operation of the dynamic flash memory cells according to the first embodiment of the present invention can also be executed.

Even if the horizontal cross-sectional shape of the Si pillar 2 illustrated in FIG. 1B is circular, elliptical, or rectangular, the dynamic flash memory operation described in the present embodiment can be performed. Additionally, dynamic flash memory cells with circular, elliptical, and rectangular horizontal cross-sectional shapes may be intermixed on the same chip.

In FIGS. 1A and 1B, a dynamic flash memory element has been illustrated using an SGT by way of example, which includes the first gate insulating layer 4a and the second gate insulating layer 4b surrounding the entire side surface of the Si column 2 standing vertically on the substrate 1, and the first gate conductor layer 5a, the second gate conductor layer 5b, and the third gate conductor layer 5c surrounding the entirety of the first gate insulating layer 4a and the second gate insulating layer 4b. As discussed in the description of the present embodiment, the dynamic flash memory element may have any structure as long as it satisfies the condition that the hole group 11 generated by impact ionization is held in the channel region 7. To this end, the channel region 7 may be a floating body structure separated from the substrate 1. Accordingly, even if the semiconductor base in the channel region is formed horizontally with respect to the substrate 1 by using gate all around (GAA) technology (for example, see E. Yoshida (2006)), which is one type of SGT, and/or nanosheet technology (see J. Y. Song, W. Y. Choi, J. H. Park, J. D. Lee, and B-G. Park: "Design Optimization of Gate-All-Around (GAA) MOSFETs," IEEE Trans. Electron Devices, Vol. 5, No. 3, pp. 186-191, May 2006), the above-mentioned dynamic flash memory operation can be performed. In addition, the dynamic flash memory element may have a device structure using a silicon on insulator (SOI) (for example, see J. Wan, L. Rojer, A. Zaslaysky, and S. Critoloveanu (2012); T. Ohsawa, K. Fujita, T. Higashi, Y. Iwata, T. Kajiyama, Y. Asao, and K. Sunouchi (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, and A. Nitayama (2006); and E. Yoshida (2006)). In this device structure, the bottom of the channel region is in contact with an insulating layer of the SOI substrate, and the other portion of the channel region is surrounded by a gate insulating layer and an element separation insulating layer. Even with this structure, the channel region has a floating body structure. As mentioned above, it is sufficient for the dynamic flash memory element provided by the present embodiment to satisfy the condition that the channel region has a floating body structure. Alternatively, even with a structure where a fin transistor (for example, see H. Jiang, N. Xu, B. Chen, L. Zengl, Y. He, G. Du, X. Liu and X. Zhang: "Experimental investigation of self-heating effect (SHE) in multiple-fin SOI FinFETs," Semicond. Sci. Technol. 29 (2014) 115021 (7 pp)) formed on an SOI substrate, if the channel region has a floating body structure, the dynamic flash operation can be performed.

Moreover, formulas (1) to (4) of the present specification and the drawings are expressions used to qualitatively describe the phenomenon, and the phenomenon is not limited by these formulas.

In FIG. 5A and its description, one example of the condition of a page erase operation has been discussed. In contrast, if a state in which the hole group 11 in the channel region 7 is extracted from one or both of the N$^+$ layer 3$a$ and the N$^+$ layer 3$b$ can be realized, the voltages applied to the source line SL, the first plate line PL1, the second plate line PL2, the bit line BL, and the word line WL may be changed. In a page erase operation, a voltage may be applied to the source line SL of the selected page, and the bit line BL may be in a floating state. Alternatively, in a page erase operation, a voltage may be applied to the bit line BL of the selected page, and the source line SL may be in a floating state.

In FIGS. 1A and 1B, in the vertical direction, the potential distributions of the first channel region 7$a$ and the second channel region 7$b$ are formed in connection in the channel region 7 in a portion surrounded by the insulating layer 6, which is the first insulating layer. Accordingly, the channel region 7 in the first channel region 7$a$ and the channel region 7 in the second channel region 7$b$ are connected, in the vertical direction, in a region surrounded by the insulating layer 6, which is the first insulating layer.

Note that, in FIGS. 1A and 1B, it is desirable that the vertical length of the first gate conductor layer 5$a$ and the second gate conductor layer 5$b$ to which the first plate line PL1 and the second plate line PL2 are connected be yet longer than the vertical length of the third gate conductor layer 5$c$ to which the word line WL is connected to satisfy $C_{PL1}+C_{PL2}>C_{WL}$. However, just by adding the first plate line PL1 and the second plate line PL2, the coupling ratio of the capacitive coupling $(C_{WL}/(C_{PL1}+C_{PL2}+C_{WL}+C_{BL}+C_{SL}))$ of the word line WL to the channel region 7 is reduced. As a result, the potential variation $\Delta V_{FB}$ of the channel region 7 of the floating body becomes smaller.

In addition, in FIGS. 1A and 1B, the positions of the first gate conductor layer 5$a$ and the second gate conductor layer 5$b$ to which the first plate line PL1 and the second plate line PL2 are connected may be moved vertically upward to the second impurity layer 3$b$ side, and the position of the third gate conductor layer 5$c$ to which the word line WL is connected may be vertically moved downward to the first impurity layer 3$a$ side. This also enables the above-mentioned dynamic flash memory operation to be performed.

In the present specification and the claims, the meaning of "covering" as in the case of "a gate insulating layer, a gate conductor layer, and the like cover a channel and the like" includes the case of being entirely surrounded as in SGT and GAA, the case of being surrounded with a portion left as in a fin transistor, and the case of overlapping on a planar thing as in a planar-type transistor.

Although a page erase operation of one-bit dynamic flash memory cells each of which includes one semiconductor base has been described with reference to FIGS. 6A to 6E, the present invention is also effective for a page erase operation of one-bit high-speed dynamic flash memory cells each of which includes two semiconductor matrices storing the complementary data "1" and "0".

Although a page erase operation in a single-layer memory array of one-bit dynamic flash memory cells each of which includes one semiconductor base has been described with reference to FIGS. 6A to 6E, the present invention is also effective for a multilayer memory array consisting of multiple layers of one-bit dynamic flash memory cells each of which includes one semiconductor base.

Note that, in FIGS. 5A, 5B, and 6A to 6E, the third gate conductor layer 5$c$ connected to the word line WL may be divided into at least two gate conductor layers. The separated gate conductor layers can be operated synchronously or asynchronously to satisfy the functionality of the dynamic flash memory cell.

The present embodiment provides the following features.
Feature 1

In the dynamic flash memory cell according to the first embodiment of the present invention, when performing write and read operations, the voltage of the word line WL swings up and down. At this time, the first gate conductor layer 5$a$ and the second gate conductor layer 5$b$ connected to the first plate line PL1 and the second plate line PL2 serve to reduce the capacitive coupling ratio between the word line WL and the channel region 7. As a result, the influence of a change in the voltage of the channel region 7 when the voltage of the word line WL swings up and down can be significantly suppressed. This can increase the threshold voltage difference of the SGT transistor of the word line WL indicating logic "0" and "1". This leads to an expansion of the operating margin of the dynamic flash memory cell. In logic "0" data readout, by setting the voltage applied to the first plate line PL1 higher than the threshold voltage at the time of logic storage data "1" and lower than the threshold voltage at the time of logic storage data "0", the characteristic that no current flows even if the word line WL voltage is increased can be obtained. This leads to a further expansion of the operating margin of the dynamic flash memory cell.
Feature 2

In the first embodiment of the present invention, the first gate conductor layer 5$a$ connected to the first plate line PL1 and the second gate conductor layer 5$b$ connected to the second plate line PL2 are formed at a separation surrounding the first gate insulating layer 4$a$. By making the voltage applied to the second plate line PL2 lower than the voltage applied to the first plate line PL1, a hole group is accumulated in the channel region 7$a$ near the second gate conductor layer 5$b$ connected to the second plate line PL2. Accordingly, a larger hole group can be accumulated compared to the structure in which the whole channel region 7$a$ is surrounded by a single gate electrode. Moreover, in the readout operation, the floating body voltage of the channel region 7$a$ can be controlled by the voltage applied to the second gate conductor layer 5$b$. In doing so, a more stable back bias effect can be maintained in the readout operation. Accordingly, the dynamic flash memory cell with a wider operating margin is realized.
Feature 3

A page erase operation can be performed in a ground voltage state without inputting a positive or negative bias pulse to the bit line BL and the source line SL of the dynamic flash memory cell according to the first embodiment of the present invention. As a result, disturbance to non-selected memory cells can be significantly suppressed, and a highly reliable semiconductor memory device can be provided. In addition, there is no need to select a bit line BL and a source line SL for a page erase operation, and a high-speed compact circuit can be provided. As a result, a semiconductor device using a low-power-consumption low-cost semiconductor memory can be realized.

Other Embodiments

Although a Si column is formed in the present invention, a semiconductor column made of a semiconductor material other than Si may be formed. This also applies to other embodiments according to the present invention.

The present invention allows various embodiments and modifications to be made without departing from the broad spirit and scope of the present invention. Moreover, each of the above embodiments is intended to describe one example of the present invention, and is not intended to limit the scope of the invention. The above examples and modifications can be appropriately combined. Furthermore, even if some of the components or elements of each of the above embodiments are removed as necessary, it is also within the scope of the technical idea of the present invention.

According to a memory device using a semiconductor element according to the present invention, a dynamic flash memory which is a memory device using a high-performance SGT having a high density can be obtained.

What is claimed is:

1. A memory device using a semiconductor element in which a page is composed of a plurality of memory cells arrayed on a substrate in a row direction, and a plurality of pages are arrayed in a column direction,
    each of the memory cells included in each of the pages comprising:
    a semiconductor base standing on the substrate in a vertical direction relative to the substrate or extending on the substrate in a horizontal direction relative to the substrate;
    a first impurity layer and a second impurity layer at two ends of the semiconductor base;
    a first gate insulating layer surrounding a portion or all of a side surface of the semiconductor base between the first impurity layer and the second impurity layer, the first gate insulating layer being in contact with or proximate to the first impurity layer;
    a second gate insulating layer surrounding the side surface of the semiconductor base, being connected to the first gate insulating layer, and being in contact with or proximate to the second impurity layer;
    a first gate conductor layer and a second gate conductor layer covering two opposite side surfaces of the first gate insulating layer while being separate from each other;
    a third gate conductor layer covering the second gate insulating layer; and
    a channel semiconductor layer of the semiconductor base covered with the first gate insulating layer and the second gate insulating layer, wherein:
    a voltage applied to the first gate conductor layer, the second gate conductor layer, the third gate conductor layer, the first impurity layer, and the second impurity layer is controlled to form a hole group by impact ionization inside the channel semiconductor layer, and the hole group is held;
    in a page write operation, a voltage of the channel semiconductor layer is set to a first data holding voltage that is higher than a voltage of one or both of the first impurity layer and the second impurity layer;
    in a page erase operation, a voltage applied to the first impurity layer, the second impurity layer, the first gate conductor layer, the second gate conductor layer, and the third gate conductor layer is controlled to extract the hole group from one or both of the first impurity layer and the second impurity layer, and the voltage of the channel semiconductor layer is set to a second data holding voltage that is lower than the first data holding voltage;
    of the memory cell, the first impurity layer is connected to a source line, the second impurity layer is connected to a bit line, the first gate conductor layer is connected to a first plate line, the second gate conductor layer is connected to a second plate line, and the third gate conductor layer is connected to a word line;
    in the page erase operation, the hole group in the channel semiconductor layer is extracted from one or both of the first impurity layer and the second impurity layer by lowering the second plate line from a first voltage to a second voltage at a first time, raising the first plate line from a third voltage to a fourth voltage and raising a voltage of the word line from a fifth voltage to a sixth voltage at a second time, and returning the second plate line from the second voltage to the first voltage at a third time; and
    the voltage of the channel semiconductor layer, to which the first plate line and the word line are capacitively coupled, is lowered to the second data holding voltage by returning the first plate line from the fourth voltage to the third voltage and returning the voltage of the word line from the sixth voltage to the fifth voltage at a fourth time.

2. The memory device using the semiconductor element according to claim 1, wherein:
    one or both of the first plate line and the second plate line of the memory cells arrayed in the row direction and the column direction are disposed to be shared by the adjacent memory cells.

3. The memory device using the semiconductor element according to claim 1, wherein:
    one or both of the first voltage and the fifth voltage are a ground voltage.

4. The memory device using the semiconductor element according to claim 3, wherein:
    the second voltage is a negative voltage lower than the ground voltage.

5. The memory device using the semiconductor element according to claim 1, wherein:
    a total capacitance of a first gate capacitance between the first gate conductor layer and the channel semiconductor layer and a second gate capacitance between the second gate conductor layer and the channel semiconductor layer is larger than a third gate capacitance between the third gate conductor layer and the channel semiconductor layer.

6. The memory device using the semiconductor element according to claim 1, wherein:
    when viewed from an axial direction of the semiconductor base, the first gate conductor layer and the second gate conductor layer are opposite and separate from each other while surrounding the first gate insulating layer.

7. The memory device using the semiconductor element according to claim 1, wherein:
    the impact ionization occurs inside the channel semiconductor layer between the first gate conductor layer and the third gate conductor layer, and generates the hole group inside the channel semiconductor layer.

8. The memory device using the semiconductor element according to claim 1, wherein:
    the source line is separated every memory cells arrayed in the column direction, and is arranged parallel to the word line, the first plate line, and the second plate line.

9. The memory device using the semiconductor element according to claim 1, wherein:

in an all-page erase operation, an all-page selection signal is input to a row decoder circuit, and all the pages are selected and erased.

10. The memory device using the semiconductor element according to claim 1, wherein:
in the page erase operation, a fixed voltage is applied as a voltage of the source line and the bit line.

11. A memory device using a semiconductor element in which a page is composed of a plurality of memory cells arrayed on a substrate in a row direction, and a plurality of pages are arrayed in a column direction,
each of the memory cells included in each of the pages comprising:
a semiconductor base standing on the substrate in a vertical direction relative to the substrate or extending on the substrate in a horizontal direction relative to the substrate;
a first impurity layer and a second impurity layer at two ends of the semiconductor base;
a first gate insulating layer surrounding a side surface of the semiconductor base between the first impurity layer and the second impurity layer, the first gate insulating layer being in contact with or proximate to the first impurity layer;
a second gate insulating layer surrounding a portion or all of the side surface of the semiconductor base, being connected to the first gate insulating layer, and being in contact with or proximate to the second impurity layer;
a first gate conductor layer and a second gate conductor layer covering two opposite side surfaces of the second gate insulating layer while being separate from each other;
a third gate conductor layer covering the first gate insulating layer; and
a channel semiconductor layer of the semiconductor base covered with the first gate insulating layer and the second gate insulating layer, wherein:
a voltage applied to the first gate conductor layer, the second gate conductor layer, the third gate conductor layer, the first impurity layer, and the second impurity layer is controlled to form a hole group by impact ionization inside the channel semiconductor layer, and the hole group is held;
in a page write operation, a voltage of the channel semiconductor layer is set to a first data holding voltage that is higher than a voltage of one or both of the first impurity layer and the second impurity layer;
in a page erase operation, a voltage applied to the first impurity layer, the second impurity layer, the first gate conductor layer, the second gate conductor layer, and the third gate conductor layer is controlled to extract the hole group from one or both of the first impurity layer and the second impurity layer, and the voltage of the channel semiconductor layer is set to a second data holding voltage that is lower than the first data holding voltage;
of the memory cell, the first impurity layer is connected to a source line, the second impurity layer is connected to a bit line, the first gate conductor layer is connected to a first plate line, the second gate conductor layer is connected to a second plate line, and the third gate conductor layer is connected to a word line;
in the page erase operation, the hole group in the channel semiconductor layer is extracted from one or both of the first impurity layer and the second impurity layer by lowering the second plate line from a first voltage to a second voltage at a first time, raising the first plate line from a third voltage to a fourth voltage and raising a voltage of the word line from a fifth voltage to a sixth voltage at a second time, and returning the second plate line from the second voltage to the first voltage at a third time; and
the voltage of the channel semiconductor layer, to which the first plate line and the word line are capacitively coupled, is lowered to the second data holding voltage by returning the first plate line from the fourth voltage to the third voltage and returning the voltage of the word line from the sixth voltage to the fifth voltage at a fourth time.

12. The memory device using the semiconductor element according to claim 11, wherein:
one or both of the first plate line and the second plate line of the memory cells arrayed in the row direction and the column direction are disposed to be shared by the adjacent memory cells.

13. The memory device using the semiconductor element according to claim 11, wherein:
one or both of the first voltage and the fifth voltage are a ground voltage.

14. The memory device using the semiconductor element according to claim 13, wherein:
the second voltage is a negative voltage lower than the ground voltage.

15. The memory device using the semiconductor element according to claim 11, wherein:
a total capacitance of a first gate capacitance between the first gate conductor layer and the channel semiconductor layer and a second gate capacitance between the second gate conductor layer and the channel semiconductor layer is larger than a third gate capacitance between the third gate conductor layer and the channel semiconductor layer.

16. The memory device using the semiconductor element according to claim 11, wherein:
when viewed from an axial direction of the semiconductor base, the first gate conductor layer and the second gate conductor layer are opposite and separate from each other while surrounding the second gate insulating layer.

17. The memory device using the semiconductor element according to claim 11, wherein:
the impact ionization occurs inside the channel semiconductor layer between the first gate conductor layer and the third gate conductor layer, and generates the hole group inside the channel semiconductor layer.

18. The memory device using the semiconductor element according to claim 11, wherein:
the source line is separated every memory cells arrayed in the column direction, and is arranged parallel to the word line, the first plate line, and the second plate line.

19. The memory device using the semiconductor element according to claim 11, wherein:
in an all-page erase operation, an all-page selection signal is input to a row decoder circuit, and all the pages are selected and erased.

20. The memory device using the semiconductor element according to claim 11, wherein:
in the page erase operation, a fixed voltage is applied as a voltage of the source line and the bit line.

* * * * *